United States Patent
Hirabayashi et al.

(10) Patent No.: US 7,068,090 B2
(45) Date of Patent: Jun. 27, 2006

(54) AMPLIFIER CIRCUIT

(75) Inventors: Atsushi Hirabayashi, Tokyo (JP); Kenji Komori, Kanagawa (JP)

(73) Assignee: Sony Corporation (JP)

( * ) Notice: Subject to any disclaimer, the term of this patent is extended or adjusted under 35 U.S.C. 154(b) by 4 days.

(21) Appl. No.: 10/492,041

(22) PCT Filed: Oct. 9, 2002

(86) PCT No.: PCT/JP02/10482

§ 371 (c)(1),
(2), (4) Date: Apr. 6, 2004

(87) PCT Pub. No.: WO03/034593

PCT Pub. Date: Apr. 24, 2003

(65) Prior Publication Data

US 2004/0246760 A1    Dec. 9, 2004

(30) Foreign Application Priority Data

Oct. 10, 2001  (JP)  ............................. 2001-312928
Nov. 26, 2001  (JP)  ............................. 2001-360011

(51) Int. Cl.
*H03L 5/00* (2006.01)
(52) U.S. Cl. ............................. 327/307; 327/309; 330/9
(58) Field of Classification Search ................ 327/307, 327/309, 310; 330/9, 259, 270
See application file for complete search history.

(56) References Cited

U.S. PATENT DOCUMENTS

| | | | |
|---|---|---|---|
| 3,914,702 A | 10/1975 | Gehweiler | 330/13 |
| 4,760,349 A | 7/1988 | Park et al. | 330/264 |
| 4,833,350 A | 5/1989 | Frisch | 326/64 |
| 5,544,120 A * | 8/1996 | Kuwagata et al. | 365/222 |
| 6,044,027 A * | 3/2000 | Zheng et al. | 365/194 |
| 6,160,434 A * | 12/2000 | Yoshimura et al. | 327/238 |
| 6,262,616 B1 * | 7/2001 | Srinivasan et al. | 327/264 |
| 6,275,089 B1 * | 8/2001 | Song et al. | 327/314 |
| 6,661,273 B1 * | 12/2003 | Lai et al. | 327/310 |

FOREIGN PATENT DOCUMENTS

| | | |
|---|---|---|
| EP | 0 339 679 A2 | 11/1989 |
| JP | 58-93014 U | 6/1983 |
| JP | 62-82704 A1 | 4/1987 |
| JP | 2-290327 A1 | 11/1990 |
| JP | 2002-190196 A1 | 7/2002 |

* cited by examiner

*Primary Examiner*—Tuan T. Lam
*Assistant Examiner*—Hiep Nguyen
(74) *Attorney, Agent, or Firm*—Lerner, David, Littenberg, Krumholz & Mentlik, LLP

(57) ABSTRACT

An amplifier circuit includes a CMOS inverter circuit that eliminates a DC offset caused by variations in characteristics of elements in each manufacturing process and is thus applicable to analog signal processing. The CMOS inverter circuit includes a PMOS transistor, a first NMOS transistor, a second NMOS transistor connected to the first NMOS transistor to increase a source voltage of the first NMOS transistor, and DC offset detecting means for detecting a DC offset and for applying a voltage adjusted so as to reduce the DC offset to a gate of the second NMOS transistor.

7 Claims, 9 Drawing Sheets

US 7,068,090 B2

AMPLIFIER CIRCUIT

CROSS-REFERENCE TO RELATED APPLICATIONS

The present application is a national stage application under 35 U.S.C. § 371 of International Application No. PCT/JP02/10482, filed Oct. 9, 2002, which claims priority from Japanese Application No. P2001-312928, filed Oct. 10, 2001, and from Japanese Application No. P2001-360011, filed Nov. 26, 2001.

TECHNICAL FIELD

The present invention relates to an amplifier circuit, and particularly to a CMOS inverter circuit rendered applicable to analog signal processing by eliminating a DC offset caused by variations in element characteristics. The variations occur in each manufacturing process of an NMOS transistor and a PMOS transistor forming a CMOS.

BACKGROUND ART

Recently, as production of digital apparatus has increased with progress of digital signal processing technology, CMOS integrated circuits have been widely used in semiconductor devices provided within the digital apparatus. However, there are cases where it is easier to process high-frequency signals, video signals, audio signals, and the like as analog signals. In addition, to realize A/D converter circuits, D/A converter circuits, clock oscillator circuits, and the like requires analog signal processing.

Bipolar transistors have good suitability as analog signal processing circuits. CMOS has been considered to have low suitability as analog signal processing circuits, except for a part of analog signal processing circuits such as sample-and-hold circuits or the like. However, CMOS inverter circuits, though of a very simple configuration, have advantages of a wide input dynamic range, high gain, excellent current supply capability, and the like. It is expected that reduction of overall circuit scale and improvement of performance will be realized by using a CMOS inverter circuit as an analog signal processing circuit.

FIGS. 13A and 13B are diagrams showing an example of configuration of a CMOS inverter circuit as an analog signal processing circuit. FIG. 13A shows the CMOS inverter circuit itself. FIG. 13B shows a circuit configuration in which a virtual voltage source and the like for providing an ideal operating point in performing analog signal processing are added to facilitate description of operating characteristics of the CMOS inverter circuit. In FIGS. 13A and 13B, reference numeral 201 denotes a voltage source; reference numeral 202 denotes a PMOS transistor; reference numeral 203 denotes an NMOS transistor; reference numeral 204 denotes a ground part; reference numeral 205 denotes an input terminal; reference numeral 206 denotes an output terminal; reference numeral 207 denotes a load resistance determined by drain resistance of the MOS transistors; and reference numeral 208 denotes a voltage source virtually set for bias voltage. Let Vdd be a voltage value of the voltage source 201, Vdd/2 be a voltage value of the voltage source 208, Rd be a resistance value of the load resistance 207, Ip be a drain current of the PMOS transistor 202, In be a drain current of the NMOS transistor 203, Id be a current flowing through the load resistance 207, Vg be a voltage value of an input voltage at the input terminal 205, and Vo be a voltage value of an output voltage at the output terminal 206.

Operating characteristics of the CMOS inverter circuit shown in FIGS. 13A and 13B will next be described. In the case of using the CMOS inverter circuit as an analog signal processing circuit, for as wide an input and an output dynamic range as possible, bias setting is desired to be made such that the output voltage is Vo=Vdd/2 when the input voltage is Vg=Vdd/2. The drain current Ip of the PMOS transistor 202 and the drain current In of the NMOS transistor 203 when such bias setting is made are expressed by an equation (1) and an equation (2), respectively.

$$Ip = \frac{Mp}{2}(Vdd - Vg - Vtp)^2 = \frac{Mp}{2}(Vg - Vtp)^2 \quad (1)$$

$$In = \frac{Mn}{2}(Vg - Vtn)^2 \quad (2)$$

where Mp is a drain current coefficient of the PMOS transistor 202; Vtp is a threshold voltage of the PMOS transistor 202; Mn is a drain current coefficient of the NMOS transistor 203; and Vtn is a threshold voltage of the NMOS transistor 203.

As shown in FIG. 13B, the output voltage Vo is determined by the resistance value Rd of the load resistance 207 determined by the drain resistance of the MOS transistors and the current Id flowing through the load resistance. The output voltage Vo is given by an equation (3). To realize proper bias setting, a condition for Vo=Vg=Vdd/2 is given by an equation (4).

$$Vo = \frac{Vdd}{2} + (Ip - In)Rd = \frac{Vdd}{2} + IdRd \quad (3)$$

$$Id = Ip - In = \frac{Mp}{2}(Vg - Vtp)^2 - \frac{Mn}{2}(Vg - Vtn)^2 = 0 \quad (4)$$

As shown in the equation (4), Vo=Vg when parameters such as the drain current coefficients Mp and Mn and the threshold voltages Vtp and Vtn of the PMOS transistor 202 and the NMOS transistor 203 coincide with each other. Hence, desired bias setting is realized by equalizing the parameters related to element characteristics of the PMOS transistor 202 and the NMOS transistor 203.

It is known, however, that the parameters related to element characteristics of the PMOS transistor 202 and the NMOS transistor 203 generally vary greatly due to a slight difference in a manufacturing environment occurring in each manufacturing process (such a variation in the element characteristics of the MOS transistors occurs in each manufacturing process. The variation will be hereinafter referred to as a manufacturing variation). Therefore Vo is not equal to Vg. On the basis of variations in the element characteristics, Vo>Vg when Ip>In, and Vo<Vg when Ip<In. Hence, even when the input voltage is set to Vg=Vdd/2 for bias setting, the output voltage Vo deviates from Vdd/2, causing a so-called DC offset.

Thus, because of the DC offset occurring according to the manufacturing variation, a sufficient output dynamic range cannot be obtained, and the CMOS inverter circuit as it is not suitable for use as an analog signal processing circuit such as a high-gain amplifier, a buffer amplifier, or the like.

DISCLOSURE OF INVENTION

The present invention has been made to solve problems as described above, and it is accordingly an object of the present invention to provide an amplifier circuit including a CMOS inverter circuit capable of eliminating a DC offset caused by manufacturing variations and thus applicable to analog signal processing.

According to the present invention, there is provided an amplifier circuit having a CMOS inverter circuit including a first PMOS transistor, a first NMOS transistor, and the like, in which the amplifier circuit includes both or either one of first voltage shift means for increasing a source voltage of the first NMOS transistor to reduce a DC offset and second voltage shift means for decreasing a source voltage of the first PMOS transistor to reduce the DC offset.

With such a configuration, it is possible to reduce the DC offset and increase the dynamic range of the output voltage, so that the CMOS inverter circuit can be used as an analog signal processing circuit. Further, with a configuration including both the first voltage shift means and the second voltage shift means, irrespective of relation in magnitude between threshold voltages of the PMOS transistor and the NMOS transistor and relation in magnitude between drain current coefficients of the PMOS transistor and the NMOS transistor, it is possible to reduce the DC offset and increase the dynamic range of the output voltage.

In the amplifier circuit according to the present invention, the voltage shift means includes a second MOS transistor interposed between the first NMOS transistor and a ground part or between the first PMOS transistor and a voltage source, and DC offset detecting means for applying a voltage adjusted so as to reduce the DC offset to a gate of the second MOS transistor.

With such a configuration, the source voltage of the first NMOS transistor can be increased to an appropriate level according to an amount of DC offset detected, or the source voltage of the first PMOS transistor can be decreased to an appropriate level according to the amount of DC offset detected, so that the DC offset can be eliminated completely. Thus, performance of the CMOS inverter circuit as an analog signal processing circuit can be improved.

In the amplifier circuit according to the present invention, the DC offset detecting means includes: a third PMOS transistor formed identically with the first PMOS transistor; a third NMOS transistor formed identically with the first NMOS transistor; a biasing voltage source; a fourth MOS transistor interposed between the third NMOS transistor and the ground part or between the third PMOS transistor and the voltage source, and formed identically with the second MOS transistor; and an operational amplifier having an inverting input part connected to an input part of a CMOS including the third PMOS transistor and the third NMOS transistor and having a non-inverting input part connected to an output-part of the CMOS, for applying an output voltage to the gate of the second MOS transistor and a gate of the fourth MOS transistor.

With such a configuration, it is possible to realize the DC offset detecting circuit with a simple circuit configuration and reduce a circuit scale of an analog signal processing circuit or the like using the DC offset detecting circuit.

In the amplifier circuit according to the present invention, the operational amplifier includes: a fifth NMOS transistor and a sixth NMOS transistor having drains connected to each other to form a differential pair, the fifth NMOS transistor having a gate connected to the non-inverting input part and the sixth NMOS transistor having a gate connected to the inverting input part; a fifth PMOS transistor and a sixth PMOS transistor having gates connected to each other to form a current mirror; a seventh NMOS transistor having a drain connected to a source of the fifth NMOS transistor; an eighth NMOS transistor having a drain connected to a source of the sixth NMOS transistor; a ninth NMOS transistor having a drain connected to a drain of the fifth PMOS transistor; and a tenth NMOS transistor having a drain connected to a drain of the sixth PMOS transistor; wherein a gate of the seventh NMOS transistor, a gate of the tenth NMOS transistor, and the source of the sixth NMOS transistor are connected to each other; a gate of the eighth NMOS transistor, a gate of the ninth NMOS transistor, and the source of the fifth NMOS transistor are connected to each other; and either a part connecting the drain of the fifth PMOS transistor with the drain of the ninth NMOS transistor or a part connecting the drain of the sixth PMOS transistor with the drain of the tenth NMOS transistor is connected to an output part.

With such a configuration, the differential pair including the fifth NMOS transistor and the sixth NMOS transistor and a negative conductance circuit including the seventh NMOS transistor and the eighth NMOS transistor form an amplifier having a high mutual conductance. Thus, a high-gain operational amplifier can be obtained without increasing size of the MOS transistors and without increasing bias current. Also, a circuit scale of an analog signal processing circuit or the like using the operational amplifier can be reduced.

In the amplifier circuit according to the present invention, the operational amplifier includes: a fifth PMOS transistor and a sixth PMOS transistor having drains connected to each other to form a differential pair, the fifth PMOS transistor having a gate connected to the non-inverting input part and the sixth PMOS transistor having a gate connected to the inverting input part; a fifth NMOS transistor and a sixth NMOS transistor having gates connected to each other to form a current mirror; a seventh PMOS transistor having a drain connected to a source of the fifth PMOS transistor; an eighth PMOS transistor having a drain connected to a source of the sixth PMOS transistor; a ninth PMOS transistor having a drain connected to a drain of the fifth NMOS transistor; and a tenth PMOS transistor having a drain connected to a drain of the sixth NMOS transistor; wherein a gate of the seventh PMOS transistor, a gate of the tenth PMOS transistor, and the source of the sixth PMOS transistor are connected to each other; a gate of the eighth PMOS transistor, a gate of the ninth PMOS transistor, and the source of the fifth PMOS transistor are connected to each other; and either a part connecting the drain of the fifth NMOS transistor with the drain of the ninth PMOS transistor or a part connecting the drain of the sixth NMOS transistor with the drain of the tenth PMOS transistor is connected to an output part.

With such a configuration, the differential pair including the fifth PMOS transistor and the sixth PMOS transistor and a negative conductance circuit including the seventh PMOS transistor and the eighth PMOS transistor form an amplifier having a high mutual conductance. Thus, a high-gain operational amplifier can be obtained without increasing size of the MOS transistors and without increasing bias current. Also, a circuit scale of an analog signal processing circuit or the like using the operational amplifier can be reduced.

According to the present invention, there is provided an amplifier circuit including a CMOS inverter including a first PMOS transistor and a first NMOS transistor connected in series with each other, voltage control means for variably controlling a source potential of one MOS transistor of the first PMOS transistor and the first NMOS transistor, and voltage shift means for changing a source potential of the other MOS transistor to eliminate a DC offset.

With such a configuration, by appropriately changing the source potential of the one MOS transistor and operating the voltage shift means so as to eliminate the DC offset, it is consequently possible to control a gain of the amplifier circuit provided as a CMOS including the first PMOS transistor and the first NMOS transistor. Thus an amplifier circuit capable of eliminating a DC offset and controlling the gain can be obtained.

In the amplifier circuit according to the present invention, the voltage control means includes a MOS transistor for voltage control connected to a source of the one MOS transistor, and a variable voltage source connected to a gate of the MOS transistor for voltage control.

With such a configuration, it is possible to change the source potential of the one MOS transistor by a simple configuration, and thus simplify circuit configuration.

In the amplifier circuit according to the present invention, the voltage shift means includes a MOS transistor for voltage shifting connected to a source of the other MOS transistor, and DC offset detecting means for detecting a DC offset and applying a voltage adjusted so as to eliminate the DC offset to a gate of the MOS transistor for voltage shifting.

With such a configuration, the source potential of the other MOS transistor can be changed to an appropriate level according to the amount of DC offset detected. Thus, an amplifier circuit that can reliably eliminate a DC offset and has a high precision can be obtained.

In the amplifier circuit according to the present invention, the DC offset detecting means includes: a comparing circuit obtained by connecting MOS transistors formed identically with the first PMOS transistor, the first NMOS transistor, the MOS transistor for voltage control, and the MOS transistor for voltage shifting, respectively, in identical order; and an operational amplifier having an inverting input part and a non-inverting input part connected to an input part and an output part, respectively, of a CMOS inverter including the PMOS transistor corresponding to the first PMOS transistor and the NMOS transistor corresponding to the first NMOS transistor within the comparing circuit, and having an output part connected to gates of the two MOS transistors for voltage shifting; wherein the variable voltage source is also connected to a gate of the MOS transistor for voltage control on a side of the comparing circuit.

With such a configuration, it is possible to realize the DC offset detecting means for detecting a DC offset with high precision by a simple configuration, and thus simplify circuit configuration.

The amplifier circuit according to the present invention further includes a first load MOS transistor interposed between a signal output part and a voltage source and having a drain and a gate short-circuited, and a second load MOS transistor interposed between the signal output part and a ground part and having a drain and a gate short-circuited.

With such a configuration, a load for extracting a voltage output can be provided by using the MOS transistors. It is thus possible to allow integration and reduce circuit scale.

BEST MODE FOR CARRYING OUT THE INVENTION

Embodiments of the present invention will hereinafter be described with reference to the accompanying drawings. Incidentally, in order to clarify correspondences between elements of the embodiments that are described in the embodiments of the present invention and elements or means of the invention that are described in claims, the elements or means of the invention, which are described in the claims and correspond to the respective elements of the embodiments, will be indicated by parentheses following the respective elements of the embodiments as appropriate in description below of the embodiments of the present invention.

First Embodiment

Figure 1:
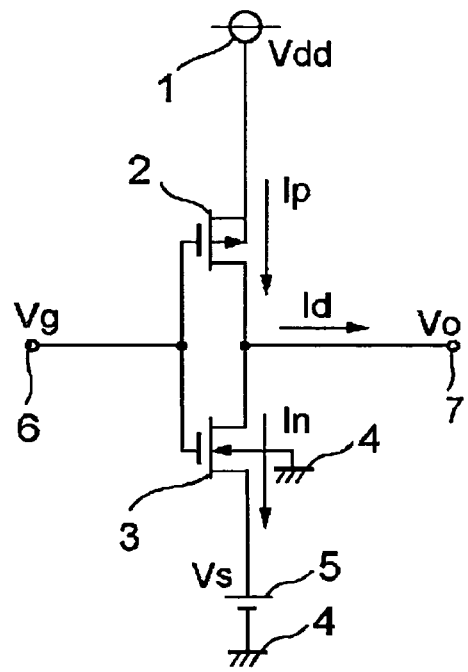
FIG. 1 is a circuit diagram of assistance in explaining operating principles of a DC offset detecting circuit according to the present invention.

FIG. 1 is a diagram of assistance in explaining operating principles of a DC offset detecting circuit according to the present invention. In FIG. 1, reference numeral 1 denotes a voltage source; reference numeral 2 denotes a PMOS transistor (third PMOS transistor); reference numeral 3 denotes an NMOS transistor (third NMOS transistor); reference numeral 4 denotes a ground part; reference numeral 5 denotes a voltage source interposed between a source of the NMOS transistor 3 and the ground part 4, for increasing a source voltage of the NMOS transistor 3 to reduce a DC offset; reference numeral 6 denotes an input terminal; and reference numeral 7 denotes an output terminal. A back gate of the PMOS transistor 2 is connected to a source of the PMOS transistor 2, and a back gate of the NMOS transistor 3 is connected to the ground part 4. Let Vdd be a voltage value of the voltage source 1, Ip be a drain current of the PMOS transistor, In be a drain current of the NMOS transistor, Id be a current flowing to the output terminal 7, Vs be a voltage value of the voltage source 5 (hereinafter referred to as a shift voltage), Vg be an input voltage, and Vo be an output voltage.

Operating characteristics of a CMOS inverter circuit shown in FIG. 1 will next be described. Also in this case, evaluation regarding a DC offset is performed with Vg=Vdd/2 for appropriate bias setting. The drain current Ip of the PMOS transistor 2 and the drain current In of the NMOS transistor 3 under the above conditions are given by an equation (5) and an equation (6), respectively.

$$Ip = \frac{Mp}{2}(Vdd - Vg - Vtp)^2 = \frac{Mp}{2}(Vg - Vtp)^2 \quad (5)$$

$$In = \frac{Mn}{2}(Vg - Vs - Vtn)^2 \quad (6)$$

Hence, the current Id as a difference between the drain current Ip of the PMOS transistor 2 and the drain current In of the NMOS transistor 3 is given by an equation (7).

$$Id = Ip - In = \frac{Mp}{2}(Vg - Vtp)^2 - \frac{Mn}{2}(Vg - Vs - Vtn)^2 \quad (7)$$

As is clear from the equation (7), it is possible to set Id=0 by appropriately adjusting the voltage value of the shift voltage Vs. At this time, the output voltage Vo coincides with the input voltage Vg. The voltage value of the shift voltage Vs that can set Id=0 is calculated from the following equation (8):

$$Vs = Vg - Vtn - \sqrt{\frac{Mp}{Mn}}(Vg - Vtp) \quad (8)$$

When a drain current coefficient Mp of the PMOS transistor 2 and a drain current coefficient Mn of the NMOS transistor 3 are equal to each other, for example, Vs=Vtp−Vtn, and hence the voltage value of the shift voltage is determined. In operation by a single power source, Vs≧0, and therefore a DC offset of the output voltage can be eliminated only when Vtp≧Vtn. Incidentally, when Vtp<Vtn, the DC offset can be similarly eliminated by interposing a voltage source for voltage shifting between a source of the PMOS transistor 2 and the voltage source 1.

When a threshold voltage Vtp of the PMOS transistor 2 and a threshold voltage Vtn of the NMOS transistor 3 are equal to each other, the voltage value of the shift voltage Vs can be determined on the basis of the following equation (9), setting Vtp=Vtn=Vt.

$$\therefore Vs = \left(1 - \sqrt{\frac{Mp}{Mn}}\right)(Vg - Vt) \quad (9)$$

In operation by a single power source, Vs≧0 and Vg−Vt>0, and therefore a DC offset of the output voltage can be eliminated only when Mp≦Mn. Incidentally, when Mp>Mn, the DC offset can be similarly eliminated by interposing a voltage source for voltage shifting between the source of the PMOS transistor 2 and the voltage source 1.

Figure 2:
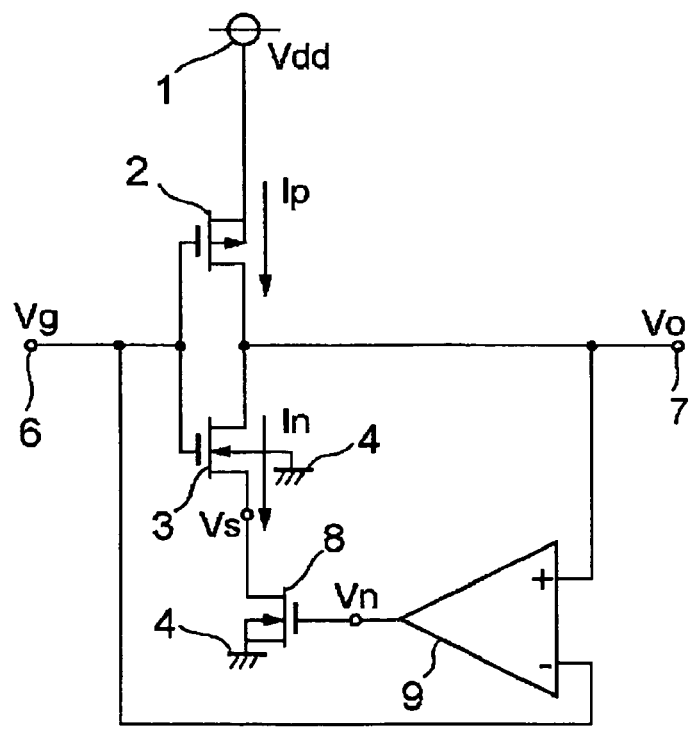
FIG. 2 is a circuit diagram showing a DC offset detecting circuit included in an amplifier circuit according to a first embodiment of the present invention.

Description will next be made of a DC offset detecting circuit (DC offset detecting means) that can automatically adjust the shift voltage to eliminate the DC offset caused by manufacturing variations. FIG. 2 is a circuit diagram showing a DC offset detecting circuit according to a first embodiment of the present invention. In FIG. 2, the same reference numerals as in FIG. 1 denote the same or corresponding parts, and therefore description thereof will be omitted. Reference numeral 8 denotes an NMOS transistor (fourth NMOS transistor) interposed between a source of an NMOS transistor 3 and a ground part 4; and reference numeral 9 denotes an operational amplifier (first operational amplifier) having a non-inverting input part connected to an output terminal 7, an inverting input part connected to an input terminal 6, and an output part connected to a gate of the NMOS transistor 8. A back gate of the NMOS transistor 8 is connected to the ground part 4.

Description will next be made of operating characteristics of the DC offset detecting circuit shown in FIG. 2.

A drain current Ip of a PMOS transistor 2 is given by an equation (10); a drain current In of the NMOS transistor 3 is given by an equation (11); and a drain current In of the NMOS transistor 8 is given by an equation (12). Analysis will be performed assuming that in order to simplify description, the NMOS transistor 3 and the NMOS transistor 8 are formed identically and that element characteristics such as drain current coefficients Mn, threshold voltages Vtn, and the like of the NMOS transistor 3 and the NMOS transistor 8 are equal to each other. It is to be noted that the DC offset detecting circuit according to the present invention does not require that the NMOS transistor 3 and the NMOS transistor 8 be formed identically. Even when these transistors are formed differently, it is of course possible to obtain circuit characteristics similar to circuit characteristics to be determined by the following numerical analysis.

$$Ip = \frac{Mp}{2}(Vdd - Vg - Vtp)^2 = \frac{Mp}{2}(Vg - Vtp)^2 \quad (10)$$

$$In = \frac{Mn}{2}(Vg - Vs - Vtn)^2 \quad (11)$$

$$In = \frac{Mn}{2}\{2(Vn - Vtn)Vs - Vs^2\} \quad (12)$$

where Vn is a gate voltage of the NMOS transistor 8. The operational amplifier 9 applies the gate voltage Vn, whereby the drain current of the NMOS transistor 8 operating in a non-saturation region and the drain current of the NMOS transistor 3 operating in a saturation region become equal to each other. From the equation (11) and the equation (12), the gate voltage Vn for generating a desired shift voltage Vs is determined as expressed by an equation (13).

$$In = \frac{Mn}{2}(Vg - Vs - Vtn)^2 \quad (13)$$

$$= \frac{Mn}{2}\{2(Vn - Vtn)Vs - Vs^2\}$$

$$(Vg - Vs - Vtn)^2 = 2(Vn - Vtn)Vs - Vs^2$$

$$\therefore Vn = Vtn + \frac{1}{2Vs}\{Vs^2 + (Vg - Vs - Vtn)^2\}$$

$$= Vs - Vg - 2Vtn + \frac{(Vg - Vtn)^2}{2Vs}$$

Since the shift voltage Vs is determined on the basis of the equation (8) as a voltage value for eliminating a DC offset of a CMOS inverter, the equation (8) is substituted in the equation (13), whereby the gate voltage Vn to be supplied to the gate of the NMOS transistor 8 to eliminate the DC offset caused by manufacturing variations is given by an equation (14).

$$Vn = \left(1 - \sqrt{\frac{Mp}{Mn}}\right)Vg + \sqrt{\frac{Mp}{Mn}}\,Vtp - Vtn -$$

$$Vg + 2Vtn + \frac{(Vg - Vtn)^2}{2\left\{\left(1 - \sqrt{\frac{Mp}{Mn}}\right)Vg + \sqrt{\frac{Mp}{Mn}}\,Vtp - Vtn\right\}}$$

$$\therefore Vn = Vtn + \sqrt{\frac{Mp}{Mn}}\,Vtp - \sqrt{\frac{Mp}{Mn}}\,Vg + \frac{(Vg - Vtn)}{2\left\{1 - \sqrt{\frac{Mp}{Mn}}\,\frac{Vg - Vtp}{Vg - Vtn}\right\}}$$

As described above, the voltage value of the gate voltage Vn required to be applied according to variations in element characteristics such as the drain current coefficient Mp, drain current coefficient Mn, threshold voltage Vtp, threshold voltage Vtn, and the like of the PMOS transistor 2, the NMOS transistor 3, and the NMOS transistor 8 is uniquely determined on the basis of the equation (14).

For example, when the drain current coefficient Mp of the PMOS transistor 2 and the drain current coefficient Mn of the NMOS transistors 3 and 8 are equal to each other, and there is a variation between the threshold voltage Vtp of the PMOS transistor 2 and the threshold voltage Vtn of the NMOS transistors 3 and 8, the gate voltage Vn is determined from an equation (15).

$$Vn = Vtp + Vtn - Vg + \frac{(Vg - Vtn)^2}{2(Vtp - Vtn)} \quad (15)$$

When the threshold voltage Vtp of the PMOS transistor 2 and the threshold voltage Vtn of the NMOS transistors 3 and 8 are equal to each other, hence Vtp=Vtn=Vt, and there is a variation between the drain current coefficient Mp of the PMOS transistor 2 and the drain current coefficient Mn of the NMOS transistors 3 and 8, the gate voltage Vn is determined from an equation (16).

$$Vn = Vt + \left(\frac{1}{2\left(1 - \sqrt{\frac{Mp}{Mn}}\right)} - \sqrt{\frac{Mp}{Mn}}\right)(Vg - Vt) \quad (16)$$

Operation of the DC offset detecting circuit shown in FIG. 2 will now be described. When an output voltage Vo becomes greater than an input voltage Vg, a voltage obtained by amplifying a differential voltage between the output voltage Vo and the input voltage Vg is applied to the gate of the NMOS transistor 8. When the gate voltage of the NMOS transistor 8 is increased, a drain resistance of the NMOS transistor is reduced, thereby decreasing the output voltage Vo. Thus, the voltage Vn outputted from the operational amplifier 9 converges at such a voltage value as to equalize the output voltage Vo and the input voltage Vg with each other.

Figure 3:
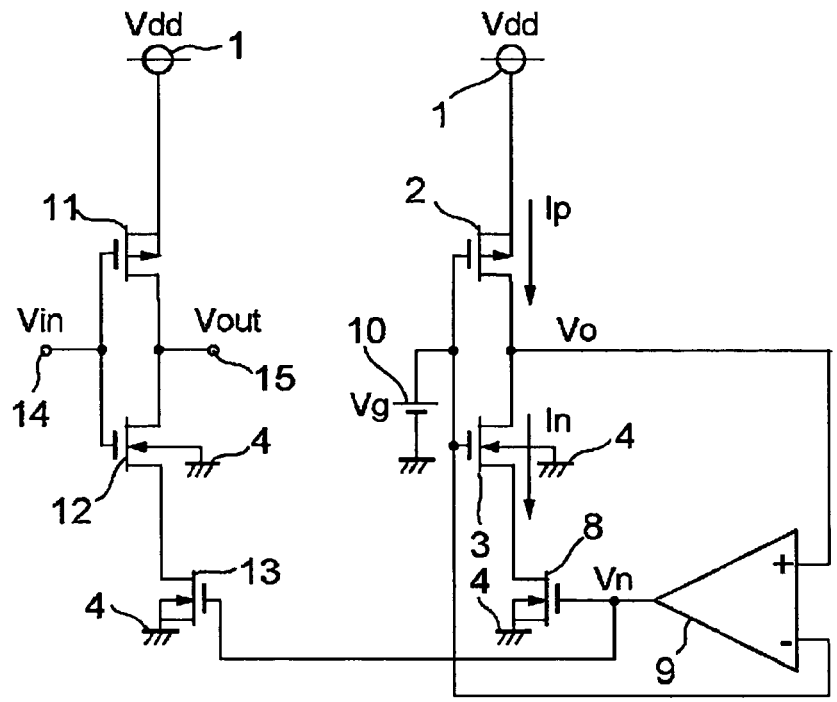
FIG. 3 is a circuit diagram showing a configuration of the amplifier circuit according to the first embodiment of the present invention.

Description will next be made of an amplifier circuit according to the first embodiment of the present invention using a DC offset detecting circuit as shown in FIG. 2. FIG. 3 is a circuit diagram showing a configuration of the amplifier circuit according to the first embodiment of the present invention. In FIG. 3, the same reference numerals as in FIG. 2 denote the same or corresponding parts, and therefore description thereof will be omitted. Reference numeral 10 denotes a voltage source (biasing voltage source) for applying a bias voltage set so as to enable analog signal processing. Reference numeral 11 denotes a PMOS transistor (first PMOS transistor) formed identically with a PMOS transistor 2. Reference numeral 12 denotes an NMOS transistor (first NMOS transistor) formed identically with an NMOS transistor 3. Reference numeral 13 denotes an NMOS transistor (second NMOS transistor) formed identically with an NMOS transistor 8. Reference numeral 14 denotes an input terminal (signal input part). Reference numeral 15 denotes an output terminal (signal output part). Let Vin be an input voltage at the input terminal 14, and Vout be an output voltage at the output terminal 15. A back gate of the PMOS transistor 11 is connected to a source of the PMOS transistor 11; a back gate of the NMOS transistor 12 is connected to a ground part 4; and a back gate of the NMOS transistor 13 is connected to the ground part 4. Incidentally, the biasing voltage source 10 can be realized by various methods such for example as dividing a power supply voltage of a voltage source 1 by resistance. Since the amplifier circuit is formed within an identical chip and therefore goes through identical manufacturing processes, the PMOS transistor 2 and the PMOS transistor 11, the NMOS transistor 3 and the NMOS transistor 12, and the NMOS transistor 8 and the NMOS transistor 13 can each be considered to have element characteristics such as drain current coefficients and threshold voltages equal to each other. That is, a circuit including the PMOS transistor 2, the NMOS transistor 3, and the NMOS transistor 8 is given as a comparing circuit formed identically with a circuit including the PMOS transistor 11, the NMOS transistor 12, and the NMOS transistor 13. The DC offset detecting circuit (first DC offset detecting means) including the PMOS transistor 2, the NMOS transistor 3, the NMOS transistor 8, an operational amplifier 9, the biasing voltage source 10, and the like, and the NMOS transistor 13 form first voltage shift means for increasing a source voltage of the NMOS transistor 12 to reduce a DC offset.

Operation of the amplifier circuit shown in FIG. 3 will next be described. As described above in the operation of the DC offset detecting circuit shown in FIG. 2, a voltage Vo at a part connecting a drain of the PMOS transistor 2 with a drain of the NMOS transistor 3 becomes equal to a bias voltage Vg given by the biasing voltage source 10 for setting a bias. Also, as described above, since the PMOS transistor 2 and the PMOS transistor 11, the NMOS transistor 3 and the NMOS transistor 12, and the NMOS transistor 8 and the NMOS transistor 13 can each be considered to have identical element characteristics, the output voltage Vout can be Vout=Vg when the input voltage Vin is Vin=Vg by applying an output voltage of the operational amplifier 9 to a gate of the NMOS transistor 13, whereby the DC offset can be eliminated. That is, the DC offset detecting circuit detects an amount of DC offset occurring inherently in a chip where the amplifier circuit having the DC offset detecting circuit is created, and applies the voltage Vn indexing the Amount of DC offset to the gate of the NMOS transistor 13 for voltage shifting, thereby eliminating the DC offset of a CMOS inverter circuit including the PMOS transistor 11, the NMOS transistor 12, and the like.

Figure 4:
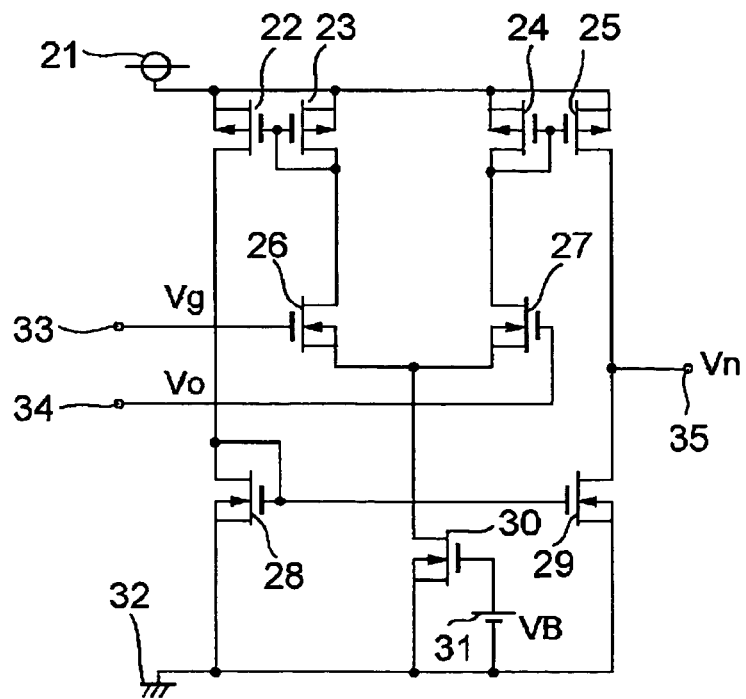
FIG. 4 is a circuit diagram showing an example of configuration of an operational amplifier used in the amplifier circuit according to the first embodiment of the present invention.

A configuration of the operational amplifier shown in FIG. 2 and FIG. 3 will next be described. FIG. 4 is a circuit diagram showing an example of configuration of the operational amplifier. In FIG. 4, reference numeral 21 denotes a voltage source; reference numerals 22, 23, 24, and 25 denote a PMOS transistor; reference numerals 26, 27, 28, 29, and 30 denote an NMOS transistor; reference numeral 31 denotes a voltage source; reference numeral 32 denotes a ground part; reference numeral 33 denotes an inverting input part; reference numeral 34 denotes a non-inverting input part; and reference numeral 35 denotes an output part.

Sources of the PMOS transistors 22, 23, 24, and 25 are connected to the voltage source 21. A gate of the PMOS transistor 22 and a gate of the PMOS transistor 23 are connected to each other, and are connected to a drain of the PMOS transistor 23. A gate of the PMOS transistor 24 and a gate of the PMOS transistor 25 are connected to each other, and are connected to a drain of the PMOS transistor 24. The NMOS transistor 26 has a drain connected to the drain of the PMOS transistor 23, and a gate connected to the inverting input part 33. The NMOS transistor 27 has a drain connected to the drain of the PMOS transistor 24, and a gate connected to the non-inverting input part 34. A source of the NMOS transistor 26 and a source of the NMOS transistor 27 are connected to each other, and are connected to a drain of the NMOS transistor 30. A drain of the NMOS transistor 28 is connected to a drain of the PMOS transistor 22, and a drain of the NMOS transistor 29 is connected to a drain of the PMOS transistor 25. A gate of the NMOS transistor 28 and a gate of the NMOS transistor 29 are connected to each other, and are connected to the drain of the NMOS transistor 28. A gate of the NMOS transistor 30 is connected to the voltage source 31. Sources of the NMOS transistors 28, 29, and 30 are connected to the ground part 32. A part connecting the drain of the PMOS transistor 25 with the drain of the NMOS transistor 29 is connected to the output part 35. Back gates of the PMOS transistors 22, 23, 24, and 25 are connected to the voltage source 21. Back gates of the NMOS transistors 26 and 27 are connected to the respective sources of the NMOS transistors 26 and 27. Back gates of the NMOS transistors 28, 29, and 30 are connected to the ground part 32.

In the operational amplifier as described above, the PMOS transistor 22 and the PMOS transistor 23, the PMOS transistor 24 and the PMOS transistor 25, and the NMOS transistor 28 and the NMOS transistor 29 each form a current mirror. The NMOS transistor 30 and the voltage source 31 form a constant-current source.

Operation of the operational amplifier shown in FIG. 4 will next be described. The inverting input part 33 of the operational amplifier is connected to an input part of a CMOS forming the DC offset detecting circuit, and the non-inverting input part 34 of the operational amplifier is connected to an output part of the CMOS forming the DC offset detecting circuit. Therefore, let Vg be a voltage applied to the inverting input part 33, Vo be a voltage applied to the non-inverting input part 34, Ig be a drain current flowing through the NMOS transistor 26 according to the gate voltage Vg, and Io be a drain current flowing through the NMOS transistor 27 according to the gate voltage Vo.

The drain current of the NMOS transistor 26, that is, a drain current of the PMOS transistor 23 is returned by the current mirror including the PMOS transistor 22 and the PMOS transistor 23 to be equal to a drain current of the PMOS transistor 22. The drain current of the PMOS transistor 22, that is, a drain current of the NMOS transistor 28 is returned by the current mirror including the NMOS transistor 28 and the NMOS transistor 29 to be equal to a drain current of the NMOS transistor 29. Thereby the drain current of the NMOS transistor 29 is Ig. The drain current of the NMOS transistor 27, that is, a drain current of the PMOS transistor 24 is returned by the current mirror including the PMOS transistor 24 and the PMOS transistor 25 to be equal to a drain current of the PMOS transistor 25. Thereby the drain current of the PMOS transistor 25 is Io. Thus, a current flowing through the output part 35 is Io−Ig.

The output voltage Vn is increased when the drain current Io flowing in from the PMOS transistor 25 is increased with respect to the drain current Ig drawn in by the NMOS transistor 29. Conversely, the output voltage Vn is decreased when the drain current Ig drawn in by the NMOS transistor 29 is increased with respect to the drain current Io flowing in from the PMOS transistor 25. Thus, the operational amplifier shown in FIG. 4 outputs the voltage Vn obtained by amplifying a differential voltage between the output voltage Vo and the input voltage Vg of the DC offset detecting circuit.

Figure 5:
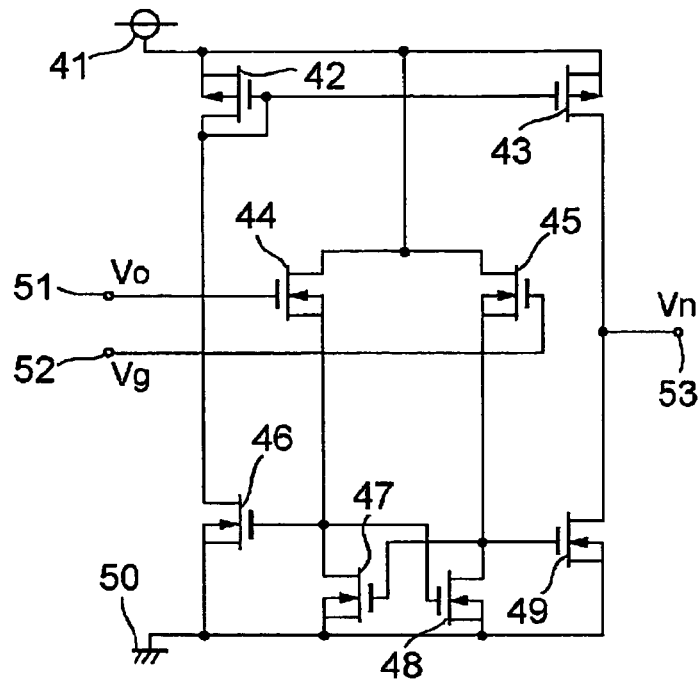
FIG. 5 is a circuit diagram showing another example of configuration of the operational amplifier used in the amplifier circuit according to the first embodiment of the present invention.

Description will next be made of a modification of the operational amplifier shown in FIG. 2 and FIG. 3. FIG. 5 is a diagram showing another example of configuration of the operational amplifier. In FIG. 5, reference numeral 41 denotes a voltage source; reference numeral 42 denotes a PMOS transistor (fifth PMOS transistor); reference numeral 43 denotes a PMOS transistor (sixth PMOS transistor); reference numeral 44 denotes an NMOS transistor (fifth NMOS transistor); reference numeral 45 denotes an NMOS transistor (sixth NMOS transistor); reference numeral 46 denotes an NMOS transistor (ninth NMOS transistor); reference numeral 47 denotes an NMOS transistor (seventh NMOS transistor); reference numeral 48 denotes an NMOS transistor (eighth NMOS transistor); reference numeral 49 denotes an NMOS transistor (tenth NMOS transistor); reference numeral 50 denotes a ground part; reference numeral 51 denotes a non-inverting input part; reference numeral 52 denotes an inverting input part; and reference numeral 53 denotes an output part.

Sources of the PMOS transistors 42 and 43 are connected to the voltage source 41. A gate of the PMOS transistor 42 and a gate of the PMOS transistor 43 are connected to each other, and are connected to a drain of the PMOS transistor 42. A drain of the NMOS transistor 44 and a drain of the NMOS transistor 45 are connected to each other. A gate of the NMOS transistor 44 is connected to the non-inverting input part 51, and a gate of the NMOS transistor 45 is connected to the inverting input part 52. The drain of the PMOS transistor 42 and a drain of the NMOS transistor 46 are connected to each other. A drain of the PMOS transistor 43 and a drain of the NMOS transistor 49 are connected to each other. A source of the NMOS transistor 44, a drain of the NMOS transistor 47, a gate of the NMOS transistor 46, and a gate of the NMOS transistor 48 are connected to each other. A source of the NMOS transistor 45, a drain of the NMOS transistor 48, a gate of the NMOS transistor 47, and a gate of the NMOS transistor 49 are connected to each other. Sources of the NMOS transistors 46, 47, 48, and 49 are connected to the ground part 50. A part connecting the drain of the PMOS transistor 43 with the drain of the NMOS transistor 49 is connected to the output part 53. Back gates of the PMOS transistors 42 and 43 are connected to the voltage source 41. Back gates of the NMOS transistors 44 and 45 are connected to the respective sources of the NMOS transistors 44 and 45. Back gates of the NMOS transistors 46, 47, 48, and 49 are connected to the ground part 50.

In the operational amplifier as described above, a differential pair including the NMOS transistor 44 and the NMOS transistor 45 and a negative conductance circuit including the NMOS transistor 47 and the NMOS transistor 48 form an amplifier having a high mutual conductance. The PMOS transistor 42 and the PMOS transistor 43, the NMOS transistor 46 and the NMOS transistor 48, and the NMOS transistor 47 and the NMOS transistor 49 each form a current mirror.

Operation of the operational amplifier shown in FIG. 5 will next be described. Also in the operational amplifier, the inverting input part 52 of the operational amplifier is connected to the input part of the CMOS forming the DC offset detecting circuit, and the non-inverting input part 51 of the operational amplifier is connected to the output part of the CMOS forming the DC offset detecting circuit. Therefore, let Vg be a voltage applied to the inverting input part 52, Vo be a voltage applied to the non-inverting input part 51, Ig be a drain current flowing through the NMOS transistor 45 according to the gate voltage Vg, and Io be a drain current flowing through the NMOS transistor 44 according to the gate voltage Vo.

The drain current of the NMOS transistor 44, that is, a drain current of the NMOS transistor 47 is returned by the current mirror including the NMOS transistor 47 and the NMOS transistor 49 to be equal to a drain current of the NMOS transistor 49. Thereby the drain current of the NMOS transistor 49 is Io. The drain current of the NMOS transistor 45, that is, a drain current of the NMOS transistor 48 is returned by the current mirror including the NMOS transistor 46 and the NMOS transistor 48 to be equal to a drain current of the NMOS transistor 46. The drain current of the NMOS transistor 46, that is, a drain current of the PMOS transistor 42 is returned by the current mirror including the PMOS transistor 42 and the PMOS transistor 43 to be equal to a drain current of the PMOS transistor 43. Thereby the drain current of the PMOS transistor 43 is Ig. Thus, a current flowing through the output part 53 is Ig–Io. The output voltage Vn is increased when the drain current Io drawn in by the NMOS transistor 49 is decreased with respect to the drain current Ig flowing in from the PMOS transistor 43. Conversely, the output voltage Vn is decreased when the drain current Io drawn in by the NMOS transistor 49 is increased with respect to the drain current Ig flowing in from the PMOS transistor 43. The gate of the NMOS transistor 47 is connected to a part connecting the source of the NMOS transistor 45 with the drain of the NMOS transistor 48, and the gate of the NMOS transistor 48 is connected to a part connecting the source of the NMOS transistor 44 with the drain of the NMOS transistor 47. Thereby, when the voltage Vo becomes higher than the voltage Vg, a current amount of the current Ig is increased, and a current amount of the current Io is decreased substantially. When the voltage Vg becomes higher than the voltage Vo, the current amount of the current Io is increased, and the current amount of the current Ig is decreased substantially. Thus, the operational amplifier having negative conductance characteristics as described above outputs the voltage Vn obtained by amplifying a differential voltage between the output voltage Vo and the input voltage Vg of the DC offset detecting circuit.

A difference between the operational amplifier shown in FIG. 4 and the operational amplifier shown in FIG. 5 will be described. An open loop gain of the operational amplifier as shown in FIG. 4 is generally determined on the basis of transistor size of the NMOS transistors 26 and 27 forming a differential pair and a bias current flowing through the constant-current source. Therefore, when the open loop gain is to be increased to eliminate a DC offset, there arise needs to increase the size of the MOS transistors and increase the bias current, thus resulting in disadvantages of a larger circuit scale and increased current consumption.

On the other hand, in the operational amplifier as shown in FIG. 5, a differential pair including the NMOS transistor 44 and the NMOS transistor 45 and a negative conductance circuit including the NMOS transistor 47 and the NMOS transistor 48 form an amplifier having a high mutual conductance. Thus, a high-gain operational amplifier can be obtained without increasing the size of the MOS transistors and without increasing the bias current.

As described above, according to the first embodiment, the CMOS inverter circuit is formed with voltage shift means for increasing the source voltage of the NMOS transistor 12 to reduce a DC offset. It is therefore possible to reduce the DC offset and increase a dynamic range of the output voltage, so that the CMOS inverter circuit can be used as an analog signal processing circuit. Further, since a correcting circuit does not need to be added to the output part of the CMOS including the PMOS transistor 11 and the NMOS transistor 12, it is possible to suppress degradation in frequency characteristics due to parasitic capacitance, degradation in noise performance, and increase in current consumption.

Further, the voltage shift means includes the NMOS transistor 13 and the DC offset detecting means for detecting a DC offset and applying a voltage adjusted so as to reduce the DC offset to the gate of the NMOS transistor 13. The voltage shift means can therefore increase the source voltage of the NMOS transistor 12 to an appropriate level according to the detected DC offset amount to eliminate the DC offset. Thus, performance of the CMOS inverter circuit as an analog signal processing circuit can be improved.

Further, the DC offset detecting circuit includes: the PMOS transistor 2 formed identically with the PMOS transistor 11; the NMOS transistor 3 formed identically with the NMOS transistor 12; the NMOS transistor 8 formed identically with the NMOS transistor 13; the operational amplifier 9 for amplifying a differential voltage between the bias voltage and the output voltage of the CMOS including the PMOS transistor 2, the NMOS transistor 3, and the like; and the like. It is therefore possible to realize the DC offset detecting circuit with a simple configuration and reduce a circuit scale of the amplifier circuit using the DC offset detecting circuit.

Further, the operational amplifier 9 includes: the NMOS transistors 44 and 45 forming a differential pair; the NMOS transistors 47 and 48 connected to the NMOS transistors 44 and 45, respectively; the PMOS transistors 42 and 43 forming a current mirror; and the NMOS transistors 46 and 49 connected to the PMOS transistors 42 and 43, respectively. Also, the gate of the NMOS transistor 46, the gate of the NMOS transistor 48, and the source of the NMOS transistor 44 are connected to each other, and the gate of the NMOS transistor 47, the gate of the NMOS transistor 49, and the source of the NMOS transistor 45 are connected to each other. Therefore, the differential pair including the NMOS transistor 44 and the NMOS transistor 45 and the negative conductance circuit including the NMOS transistor 47 and the NMOS transistor 48 form an amplifier having a high mutual conductance. Thus, a high-gain operational amplifier can be obtained without increasing the size of the MOS transistors forming the operational amplifier and without increasing the bias current. Also, circuit scales of the DC offset detecting circuit using the operational amplifier and the amplifier circuit using the DC offset detecting circuit can be reduced.

Second Embodiment

Figure 6:
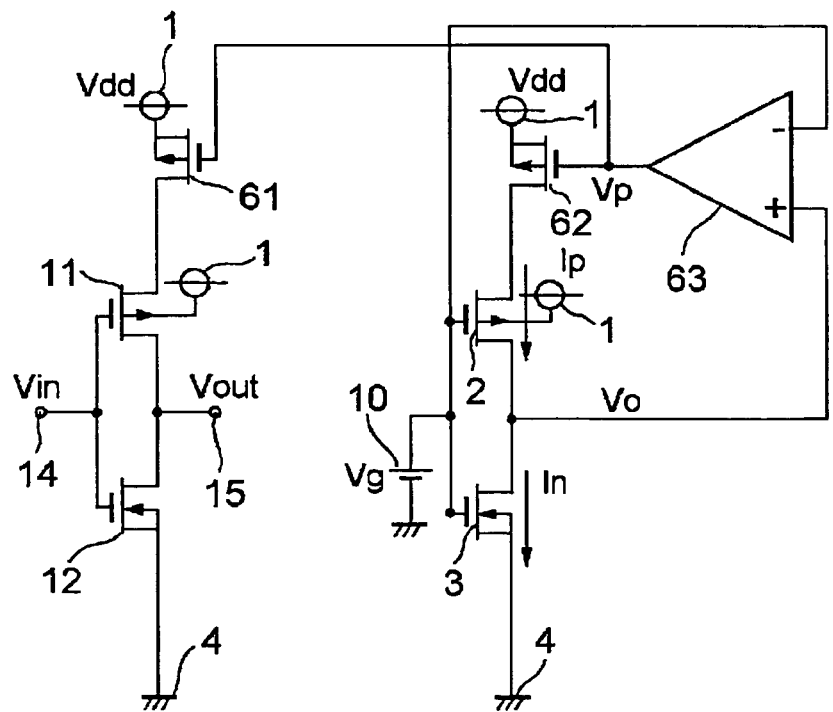
FIG. 6 is a circuit diagram showing a configuration of an amplifier circuit according to a second embodiment of the present invention.

FIG. 6 is a circuit diagram showing a configuration of an amplifier circuit according to a second embodiment of the present invention. As described above, when operated by a single power source, the amplifier circuit as shown in FIG. 3 can eliminate a DC offset when Vtp≧Vtn and when Mp≦Mn. On the other hand, the amplifier circuit according to the second embodiment of the present invention as shown in FIG. 6 can eliminate a DC offset when Vtp<Vtn and when Mp>Mn. The amplifier circuit according to the second embodiment is different from the amplifier circuit according to the first embodiment in this respect. In FIG. 6, the same reference numerals as in FIG. 3 denote the same or corresponding parts, and therefore description thereof will be omitted. Reference numeral 61 denotes a PMOS transistor (second PMOS transistor) interposed between a source of a PMOS transistor 11 and a voltage source 1, for decreasing a source voltage of the PMOS transistor 11 to eliminate a DC offset. Reference numeral 62 denotes a PMOS transistor (fourth PMOS transistor) formed identically with the PMOS transistor 61 and interposed between a source of a PMOS transistor 2 and the voltage source 1. Reference numeral 63 denotes an operational amplifier (second operational amplifier) having an inverting input part connected with a gate of the PMOS transistor 2 and a gate of an NMOS transistor 3, a non-inverting input part connected with a drain of the PMOS transistor 2 and a drain of the NMOS transistor 3, and an output part connected with a gate of the PMOS transistor 61 and a gate of the PMOS transistor 62. A back gate of the PMOS transistor 61 is connected to the voltage source 1, and a back gate of the PMOS transistor 62 is connected to the voltage source 1. Incidentally, since the amplifier circuit is formed within an identical chip and therefore goes through identical manufacturing processes, the PMOS transistor 2 and the PMOS transistor 11, the NMOS transistor 3 and an NMOS transistor 12, and the PMOS transistor 62 and the PMOS transistor 61 can each be considered to have element characteristics such as drain current coefficients and threshold voltages equal to each other. A DC offset detecting circuit (second DC offset detecting means) including the PMOS transistor 2, the NMOS transistor 3, the PMOS transistor 62, the operational amplifier 63, a biasing voltage source 10, and the like, and the PMOS transistor 61 form second voltage shift means for decreasing the source voltage of the PMOS transistor 11 to reduce a DC offset.

Operation of the amplifier circuit shown in FIG. 6 will next be described. The operation of the amplifier circuit shown in FIG. 6 is basically the same as that of the amplifier circuit shown in FIG. 3. Specifically, when an output voltage Vo of a CMOS including the PMOS transistor 2, the NMOS transistor 3, and the like becomes higher than a bias voltage Vg, a voltage resulting from amplifying a differential voltage between the output voltage Vo and the bias voltage Vg is applied to the gate of the PMOS transistor 62. When a gate voltage of the PMOS transistor 62 is increased, a drain resistance of the PMOS transistor is increased, thereby decreasing the output voltage Vo. Thus, the voltage Vp outputted from the operational amplifier 63 converges at such a voltage as to equalize the output voltage Vo and the bias voltage Vg with each other.

Since the PMOS transistor 2 and the PMOS transistor 11, the NMOS transistor 3 and the NMOS transistor 12, and the PMOS transistor 62 and the PMOS transistor 61 can each be considered to be formed identically and have identical element characteristics, the output voltage Vout can be Vout=Vg when the input voltage Vin is Vin=Vg by applying the output voltage Vp of the operational amplifier 63 to the gate of the PMOS transistor 61, whereby a DC offset can be eliminated. That is, the DC offset detecting circuit detects an amount of DC offset occurring inherently in a chip where the amplifier circuit having the DC offset detecting circuit is created, and applies the voltage Vp indexing the amount of DC offset to the gate of the PMOS transistor 61 for voltage shifting, thereby eliminating the DC offset of a CMOS inverter circuit including the PMOS transistor 11, the NMOS transistor 12, and the like.

Figure 7:
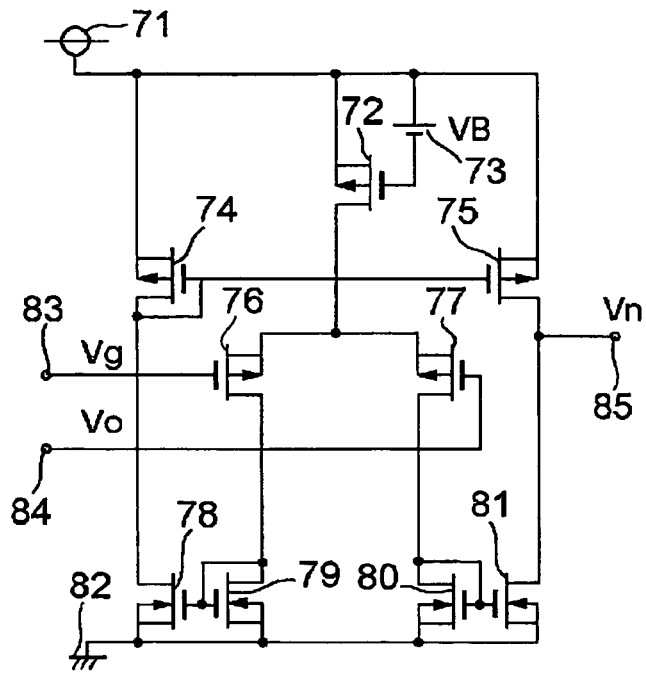
FIG. 7 is a circuit diagram showing an example of configuration of an operational amplifier used in the amplifier circuit according to the second embodiment of the present invention.

A configuration of the operational amplifier shown in FIG. 6 will next be described. FIG. 7 is a circuit diagram showing an example of configuration of the operational amplifier. In FIG. 7, reference numeral 71 denotes a voltage source; reference numeral 72 denotes a PMOS transistor; reference numeral 73 denotes a voltage source; reference numerals 74, 75, 76, and 77 denote a PMOS transistor; reference numerals 78, 79, 80, and 81 denote an NMOS transistor; reference numeral 82 denotes a ground part; reference numeral 83 denotes an inverting input part; reference numeral 84 denotes a non-inverting input part; and reference numeral 85 denotes an output part.

Sources of the PMOS transistors 72, 74, and 75 are connected to the voltage source 71. A gate of the PMOS transistor 72 is connected to a negative electrode side of the voltage source 73. A gate of the PMOS transistor 74 and a gate of the PMOS transistor 75 are connected to each other, and are connected to a drain of the PMOS transistor 74. A source of the PMOS transistor 76 and a source of the PMOS transistor 77 are connected to each other, and are connected to a drain of the PMOS transistor 72. A gate of the PMOS transistor 76 is connected to the inverting input part 83, and a gate of the PMOS transistor 77 is connected to the non-inverting input part 84. The drain of the PMOS transistor 74 is connected to a drain of the NMOS transistor 78. A drain of the PMOS transistor 76 is connected to a drain of the NMOS transistor 79. A drain of the PMOS transistor 77 is connected to a drain of the NMOS transistor 80. A drain of the PMOS transistor 75 is connected to a drain of the NMOS transistor 81. A gate of the NMOS transistor 78 and a gate of the NMOS transistor 79 are connected to each other, and are connected to the drain of the NMOS transistor 79. A gate of the NMOS transistor 80 and a gate of the NMOS transistor 81 are connected to each other, and are connected to the drain of the NMOS transistor 80. A source of the NMOS transistor 78, a source of the NMOS transistor 79, a source of the NMOS transistor 80, and a source of the NMOS transistor 81 are connected to the ground part 82. A part connecting the drain of the PMOS transistor 75 with the drain of the NMOS transistor 81 is connected to the output part 85. Back gates of the PMOS transistors 72, 74, and 75 are connected to the voltage source 71. Back gates of the PMOS transistors 76 and 77 are connected to the respective sources of the PMOS transistors 76 and 77. Back gates of the NMOS transistors 78, 79, 80, and 81 are connected to the ground part 82.

In the operational amplifier as described above, the PMOS transistor 74 and the PMOS transistor 75, the NMOS transistor 78 and the NMOS transistor 79, and the NMOS transistor 80 and the NMOS transistor 81 each form a current mirror. The PMOS transistor 72 and the voltage source 73 form a constant-current source. As compared with the operational amplifier shown in FIG. 4, the operational amplifier shown in FIG. 7 is formed only by interchanging NMOS and PMOS with each other. Basic operation of the operational amplifier shown in FIG. 7 is the same as that of the operational amplifier shown in FIG. 4, and therefore description of the operation will be omitted.

Figure 8:
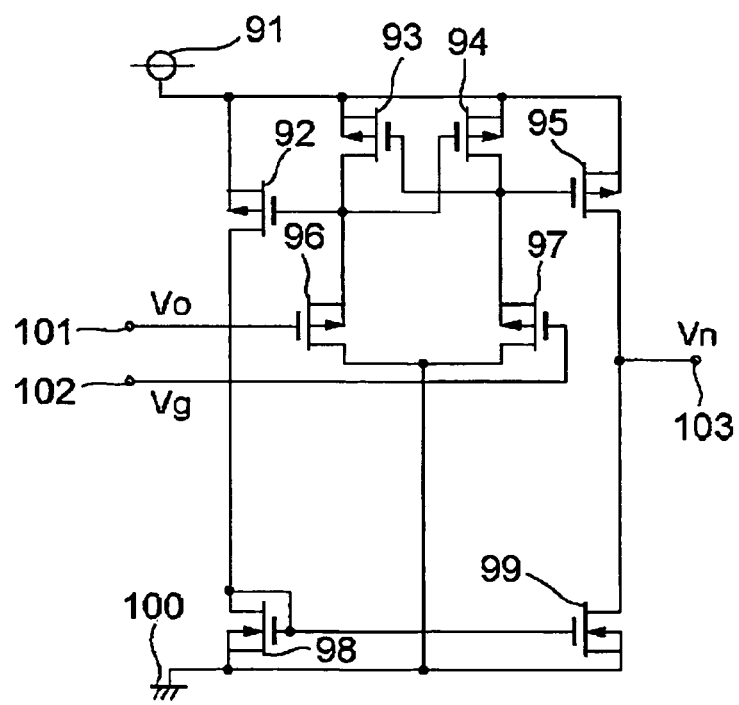
FIG. 8 is a circuit diagram showing another example of configuration of the operational amplifier used in the amplifier circuit according to the second embodiment of the present invention.

Description will next be made of a modification of the operational amplifier shown in FIG. 6. FIG. 8 is a diagram showing another example of configuration of the operational amplifier. In FIG. 8, reference numeral 91 denotes a voltage source; reference numeral 92 denotes a PMOS transistor (ninth PMOS transistor); reference numeral 93 denotes a PMOS transistor (seventh PMOS transistor); reference numeral 94 denotes a PMOS transistor (eighth PMOS transistor); reference numeral 95 denotes a PMOS transistor (tenth PMOS transistor); reference numeral 96 denotes a PMOS transistor (fifth PMOS transistor); reference numeral 97 denotes a PMOS transistor (sixth PMOS transistor); reference numeral 98 denotes an NMOS transistor (fifth NMOS transistor); reference numeral 99 denotes an NMOS transistor (sixth NMOS transistor); reference numeral 100 denotes a ground part; reference numeral 101 denotes a non-inverting input part; reference numeral 102 denotes an inverting input part; and reference numeral 103 denotes an output part.

A source of the PMOS transistor 92, a source of the PMOS transistor 93, a source of the PMOS transistor 94, and a source of the PMOS transistor 95 are connected to the voltage source 91. A drain of the PMOS transistor 92 is connected to a drain of the NMOS transistor 98. A drain of the PMOS transistor 95 is connected to a drain of the NMOS transistor 99. A drain of the PMOS transistor 93 is connected to a source of the PMOS transistor 96. A drain of the PMOS transistor 94 is connected to a source of the PMOS transistor 97. The drain of the PMOS transistor 93, the source of the PMOS transistor 96, a gate of the PMOS transistor 92, and a gate of the PMOS transistor 94 are connected to each other. The drain of the PMOS transistor 94, the source of the PMOS transistor 97, a gate of the PMOS transistor 93, and a gate of the PMOS transistor 95 are connected to each other. A gate of the PMOS transistor 96 is connected to the non-inverting input part 101. A gate of the PMOS transistor 97 is connected to the inverting input part 102. A drain of the PMOS transistor 96 and a drain of the PMOS transistor 97 are connected to each other, and are connected to the ground part 100. A gate of the NMOS transistor 98 and a gate of the NMOS transistor 99 are connected to each other, and are connected to a drain of the NMOS transistor 98. A source of the NMOS transistor 98 and a source of the NMOS transistor 99 are connected to the ground part 100. A part connecting the drain of the PMOS transistor 95 with the drain of the NMOS transistor 99 is connected to the output part 103.

In the operational amplifier as described above, a differential pair including the PMOS transistor 96 and the PMOS transistor 97 and a negative conductance circuit including the PMOS transistor 93 and the PMOS transistor 94 form an amplifier having a high mutual conductance. The PMOS transistor 92 and the PMOS transistor 94, the PMOS transistor 93 and the PMOS transistor 95, and the NMOS transistor 98 and the NMOS transistor 99 each form a current mirror. As compared with the operational amplifier shown in FIG. 5, the operational amplifier shown in FIG. 8 is formed only by interchanging NMOS and PMOS with each other. Basic operation of the operational amplifier shown in FIG. 8 is the same as that of the operational amplifier shown in FIG. 5, and therefore description of the operation will be omitted.

A difference between the operational amplifier shown in FIG. 7 and the operational amplifier shown in FIG. 8 will be described. An open loop gain of the operational amplifier as shown in FIG. 7 is generally determined on the basis of transistor size of the PMOS transistors 76 and 77 forming a differential pair and a bias current flowing through the constant-current source. Therefore, when the open loop gain is to be increased to eliminate a DC offset, there arise needs to increase the size of the MOS transistors and increase the bias current, thus resulting in disadvantages of a larger circuit scale and increased current consumption.

On the other hand, in the operational amplifier as shown in FIG. 8, a differential pair including the PMOS transistor 96 and the PMOS transistor 97 and a negative conductance circuit including the PMOS transistor 93 and the PMOS transistor 94 form an amplifier having a high mutual conductance. Thus, a high-gain operational amplifier can be obtained without increasing the size of the MOS transistors and without increasing the bias current.

As described above, as compared with the amplifier circuit according to the first embodiment that has a function of reducing a DC offset when $Vtp \geq Vtn$ and when $Mp \leq Mn$, the second embodiment has similar effects to those of the first embodiment in reducing a DC offset and the like when $Vtp < Vtn$ and when $Mp > Mn$.

Third Embodiment

Figure 9:
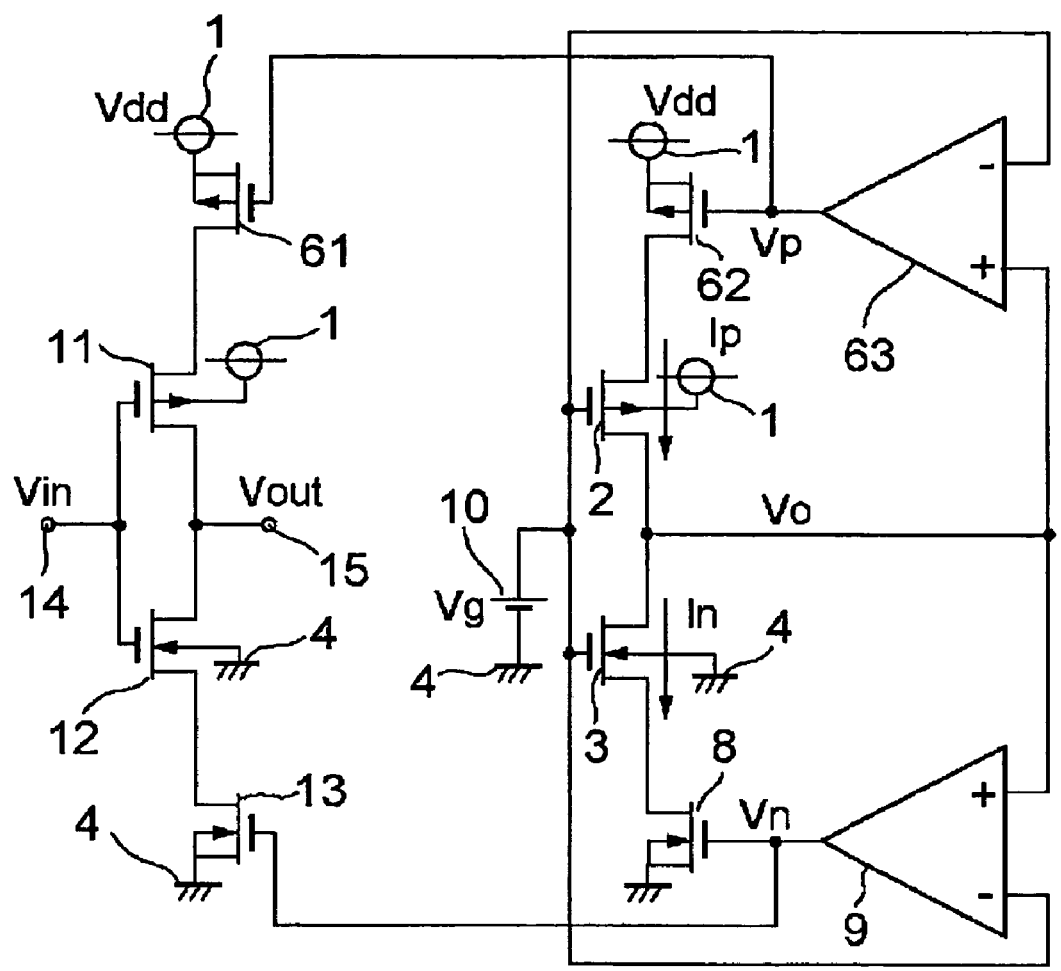
FIG. 9 is a circuit diagram showing a configuration of an amplifier circuit according to a third embodiment of the present invention.

An amplifier circuit according to a third embodiment of the present invention is different from those of the first embodiment and the second embodiment in that common parts are provided for the first voltage shift means for increasing the source voltage of the NMOS transistor forming the CMOS inverter circuit as shown in FIG. 3 and the second voltage shift means for decreasing the source voltage of the PMOS transistor forming the CMOS inverter circuit as shown in FIG. 6, whereby the two voltage shift means are realized in conjunction with each other by a simple configuration. FIG. 9 is a circuit diagram showing a configuration of the amplifier circuit according to the third embodiment of the present invention. In FIG. 9, the same reference numerals as in FIG. 3 and FIG. 6 denote the same or corresponding parts, and therefore description thereof will be omitted.

Operation of the amplifier circuit shown in FIG. 9 will next be described. When $Vtp \geq Vtn$ and when $Mp \leq Mn$, an operational amplifier 9 functions so that a voltage Vn outputted from the operational amplifier 9 to an NMOS transistor 8 converges at such a voltage as to equalize an output voltage Vo of a CMOS including a PMOS transistor 2 and an NMOS transistor 3 with a bias voltage Vg. When Vtp<Vtn and when Mp>Mn, an operational amplifier 63 functions so that a voltage Vp outputted from the operational amplifier 63 to a PMOS transistor 62 converges at such a voltage as to equalize the output voltage Vo of the CMOS including the PMOS transistor 2 and the NMOS transistor 3 with the bias voltage Vg.

The PMOS transistor 62 and a PMOS transistor 61, the PMOS transistor 2 and a PMOS transistor 11, the NMOS transistor 3 and an NMOS transistor 12, and the NMOS transistor 8 and an NMOS transistor 13 can each be considered to be formed identically and have identical element characteristics. Therefore, by inputting the output voltage Vn of the operational amplifier 9 to the NMOS transistor 13 and by inputting the output voltage Vp of the operational amplifier 63 to the PMOS transistor 61, an output voltage Vout can be Vout=Vg when an input voltage Vin is Vin=Vg. Thereby a DC offset can be eliminated. That is, first DC offset detecting means including the PMOS transistor 2, the NMOS transistors 3 and 8, the operational amplifier 9, a bias setting voltage source 10, and the like or second DC offset detecting means including the PMOS transistors 2 and 62, the NMOS transistor 3, the operational amplifier 63, the bias setting voltage source 10, and the like detects an amount of DC offset occurring inherently in a chip where the amplifier circuit shown in FIG. 9 is created, and applies the voltage Vn indexing the detected amount of DC offset to a gate of the NMOS transistor 13 for voltage shifting or applies the voltage Vp indexing the detected amount of DC offset to a gate of the PMOS transistor 61 for voltage shifting. Thereby the DC offset of a CMOS inverter circuit including the PMOS transistor 11, the NMOS transistor 12, and the like can be eliminated.

As described above, the third embodiment has similar effects to those of the first embodiment and the second embodiment. Also, the CMOS inverter circuit is provided with both the first voltage shift means for increasing the source voltage of the NMOS transistor 12 to reduce the DC offset and the second voltage shift means for decreasing the source voltage of the PMOS transistor 11 to reduce the DC offset. Therefore, irrespective of relation in magnitude between the threshold voltages Vtp and Vtn and relation in magnitude between the drain current coefficients Mp and Mn, it is possible to reduce the DC offset and increase a dynamic range of the output voltage, so that the amplifier circuit including the CMOS inverter circuit can be used as an analog signal processing circuit.

Fourth Embodiment

Figure 10:
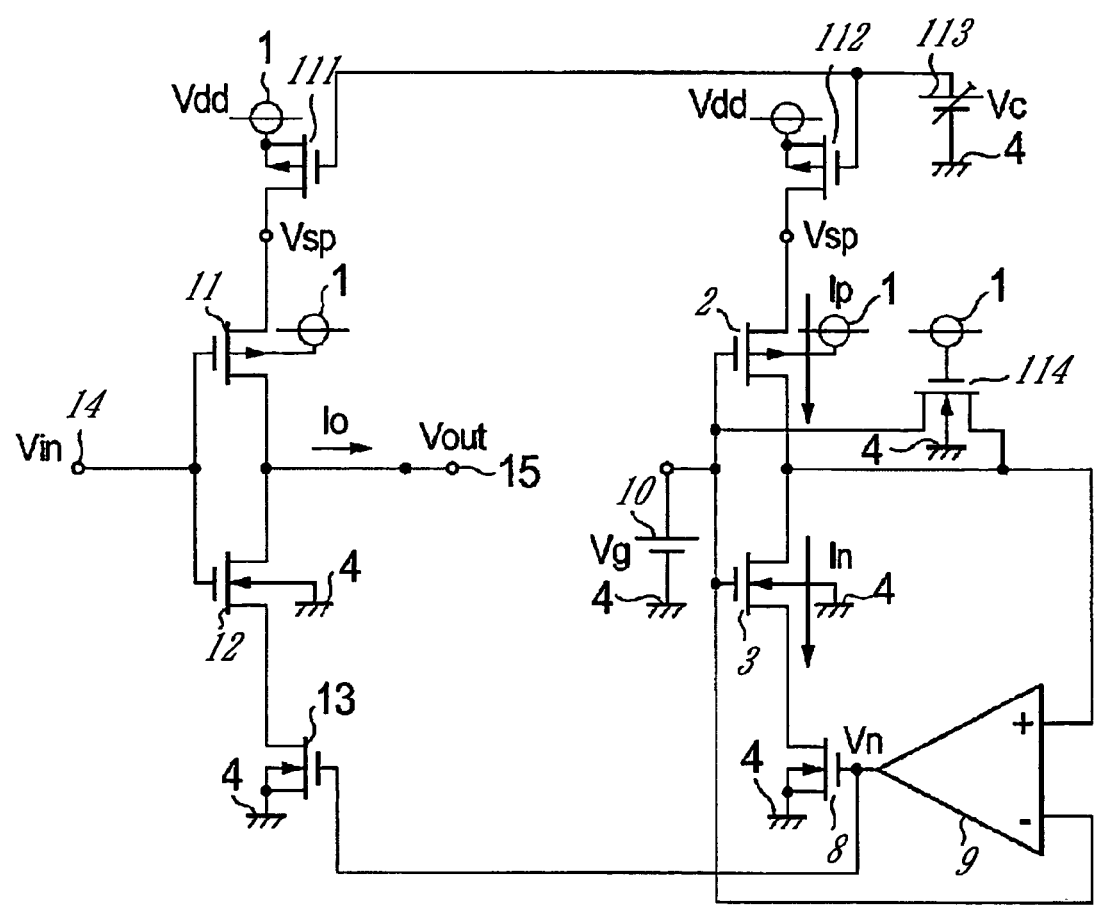
FIG. 10 is a circuit diagram showing a configuration of an amplifier circuit according to a fourth embodiment of the present invention.

An amplifier circuit according to a fourth embodiment of the present invention is different from the amplifier circuits according to the first to third embodiments in that the amplifier circuit according to the fourth embodiment has a gain varying function in addition to a DC offset eliminating function. FIG. 10 is a circuit diagram showing a configuration of the amplifier circuit according to the fourth embodiment of the present invention. In FIG. 10, the same reference numerals as in FIG. 3 denote the same or corresponding parts, and therefore description thereof will be omitted. Reference numeral 111 denotes a PMOS transistor (second PMOS transistor) interposed between a source of a PMOS transistor 11 and a voltage source 1. Reference numeral 112 denotes a PMOS transistor (fourth PMOS transistor) formed identically with the PMOS transistor 111 and interposed between a source of a PMOS transistor 2 and the voltage source 1. Reference numeral 113 denotes a variable voltage source connected to a gate of the PMOS transistor 111 and a gate of the PMOS transistor 112. Reference numeral 114 denotes an NMOS transistor having a function of preventing a latch-up phenomenon occurring at a time of turning on power or the like.

As described above, since the amplifier circuit shown in FIG. 10 is formed within an identical chip and therefore goes through identical manufacturing processes, the PMOS transistor 111 and the PMOS transistor 112 can be considered to have element characteristics such as drain current coefficients and threshold voltages equal to each other.

In this case, the PMOS transistor 111, the voltage source 113, and the like include voltage control means for variably controlling a source potential of the PMOS transistor 11. A circuit including the PMOS transistor 112, the PMOS transistor 2, an NMOS transistor 3, and an NMOS transistor 8 is given as a comparing circuit formed identically with a circuit including the PMOS transistor 111, the PMOS transistor 11, an NMOS transistor 12, and an NMOS transistor 13.

The PMOS transistor 112, the PMOS transistor 2, the NMOS transistor 3, the NMOS transistor 8, an operational amplifier 9, a biasing voltage source 10, and the like include DC offset detecting means for detecting a DC offset occurring in a CMOS inverter circuit including the PMOS transistor 11 and the NMOS transistor 12 in a state in which the source potential of the PMOS transistor 11 is changed by the voltage control means, and applying a voltage adjusted so as to eliminate the DC offset to a gate of the NMOS transistor 13. Further, the DC offset detecting means and the NMOS transistor 13 include voltage shift means for increasing a source potential of the NMOS transistor 12 to eliminate the DC offset.

Operation of the amplifier circuit shown in FIG. 10 will next be described. Let Vdd be a power supply voltage, Vc be a control voltage supplied by the variable voltage source 113, Vsp be the source potential of the PMOS transistor 11 and the PMOS transistor 2, Vg be a bias voltage supplied by the biasing voltage source 10, and Vn be an output voltage of the operational amplifier 9. As already described, the circuit including the PMOS transistor 112, the PMOS transistor 2, the NMOS transistor 3, and the NMOS transistor 8 is given as a comparing circuit formed identically with the circuit including the PMOS transistor 111, the PMOS transistor 11, the NMOS transistor 12, and the NMOS transistor 13. The same control voltage Vc is applied to the gate of the PMOS transistor 111 and the gate of the PMOS transistor 112, and the same voltage Vn for eliminating a DC offset is applied to gates of the NMOS transistor 13 and the NMOS transistor 8. Thus, for the bias voltage Vg, the MOS transistors in corresponding relation perform the same respective operations. In description below of circuit operation, numerical analysis will be performed assuming that in order to facilitate understanding, element characteristics of the PMOS transistor 111 and the PMOS transistor 11 are equal to each other and element characteristics of the NMOS transistor 12 and the NMOS transistor 13 are equal to each other. It is to be noted that the amplifier circuit according to the present invention does not require that the PMOS transistor 111 and the PMOS transistor 11, and the NMOS transistor 12 and the NMOS transistor 13 be each formed identically. Even when these transistors are formed differently, it is of course possible to obtain circuit characteristics similar to circuit characteristics to be determined by the following numerical analysis.

An equation (17) is obtained on the basis of a fact that a drain current of the PMOS transistor 111 in a non-saturation region and a drain current of the PMOS transistor 11 in a saturation region are equal to each other. An equation (18) is obtained by rearranging the equation (17). Then, by solving the equation (18) for Vsp, Vsp is given as expressed by an equation (19). As indicated by the equation (19), the source potential Vsp of the PMOS transistor 11 and the PMOS transistor 2 can be controlled by appropriately changing the voltage Vc of the variable voltage source 113.

$$2(Vdd-Vc-Vtp)(Vdd-Vsp)-(Vdd-Vsp)^2=(Vsp-Vdd+Vdd-Vg-Vtp)^2 \quad (17)$$

$$2(Vdd-Vsp)-2(2Vdd-Vg-Vc-2Vtp)(Vdd-Vsp)+(Vdd-Vg-Vtp)^2=0 \quad (18)$$

means for increasing the source potential of the NMOS transistor 12 to eliminate a DC offset. By appropriately changing the source potential of the PMOS transistor 11 and operating the voltage shift means so as to eliminate a DC offset, it is consequently possible to control the gain of the CMOS inverter circuit. Thus an amplifier circuit capable of eliminating a DC offset and controlling the gain can be obtained. In addition, since a correcting circuit does not need to be added to the output part of the CMOS inverter circuit including the PMOS transistor 11, the NMOS transistor 12, and the like, it is possible to suppress degradation in frequency characteristics due to parasitic capacitance, degradation in noise performance, and increase in current consumption.

Further, the voltage control means includes the PMOS transistor 111 interposed between the source of the PMOS $$Vsp = \frac{Vg+Vc}{2} + Vtp - \frac{1}{2}\sqrt{(2Vdd-Vg-Vc-2Vtp)^2 - 2(Vdd-Vg-Vtp)^2}$$

$$= \frac{Vg+Vc}{2} + Vtp - \frac{1}{2}\sqrt{Vc^2 - 2(2Vdd-Vg-2Vtp)Vc + (2Vdd-Vg-2Vtp)^2 - 2(Vdd-Vg-Vtp)^2}$$

$$= \frac{Vg+Vc}{2} + Vtp - \frac{1}{2}\sqrt{Vc^2 - (2Vdd-Vg-2Vtp)Vc + 2(Vdd-Vtp)^2 - Vg^2} \quad (19)$$

The DC offset detecting means applies the voltage Vn to the gate of the NMOS transistor 13 to thereby eliminate a DC offset of the CMOS inverter circuit including the PMOS transistor 111, the PMOS transistor 11, the NMOS transistor 12, the NMOS transistor 13, and the like. An output current Io of the CMOS inverter circuit is determined as expressed by an equation (20). A gain Ga of the CMOS inverter circuit is given as expressed by an equation (21). As is clear from the equation (21), the gain Ga of the CMOS inverter circuit can be controlled by appropriately changing the control voltage Vc.

$$Io = -Mp\left(1+\sqrt{\frac{Mn}{Mp}}\right)(Vsp-Vg-Vtp)Vin \quad (20)$$

$$Ga = \frac{Vout}{Vin} = -Mp\left(1+\sqrt{\frac{Mn}{Mp}}\right)(Vsp-Vg-Vtp)Ro$$

$$= Mp\left(1+\sqrt{\frac{Mn}{Mp}}\right)\left\{\frac{Vc-Vg}{2} - \frac{1}{2}\sqrt{Vc^2 - 2(Vdd-Vg-2Vtp)Vc + 2(Vdd-Vtp)^2 - Vg^2}\right\}Ro \quad (21)$$

where Ro is a resistance value of a load resistance connected to an output terminal 15. Incidentally, the NMOS transistor 114 is off in steady-state operation with a drain-to-source voltage being zero. The NMOS transistor 114 therefore has no effect on the DC offset correcting operation.

As described above, the fourth embodiment includes the voltage control means for variably controlling the source potential of the PMOS transistor 11 and the voltage shift transistor 11 and the voltage source 1, and the voltage source 113 connected to the gate of the PMOS transistor 111. It is therefore possible to change the source potential of the PMOS transistor 11 by a simple configuration, and thus simplify circuit configuration.

Further, the voltage shift means includes the NMOS transistor 13 interposed between a source of the NMOS transistor 12 and a ground part 4, and the DC offset detecting means for detecting a DC offset and applying a voltage adjusted so as to eliminate the DC offset to the gate of the NMOS transistor 13. Therefore, the source potential of the NMOS transistor 12 can be raised to an appropriate level according to an amount of DC offset detected. Thus an amplifier circuit that can reliably eliminate a DC offset and has a high precision can be obtained.

Further, the DC offset detecting means includes: the PMOS transistor 112 having a gate connected to the variable voltage source 113 and formed identically with the PMOS transistor 111; the PMOS transistor 2 connected to the PMOS transistor 112 and formed identically with the PMOS transistor 11; the NMOS transistor 3 connected to the PMOS transistor 2 and formed identically with the NMOS transistor 12; the NMOS transistor 8 connected to the NMOS transistor 3 and formed identically with the NMOS transistor 13; the voltage source 10 for applying a direct-current bias voltage to a gate of the PMOS transistor 2 and a gate of the NMOS transistor 3; and the operational amplifier 9 having an inverting input part and a non-inverting input part connected to an input part and an output part, respectively, of a CMOS including the PMOS transistor 2 and the NMOS transistor 3, and having an output part connected to the gate of the NMOS transistor 13 and the gate of the NMOS transistor 8. It is therefore possible to realize the DC offset detecting means for detecting a DC offset with high precision by a simple configuration, and thus simplify circuit configuration.

Fifth Embodiment

Figure 11:
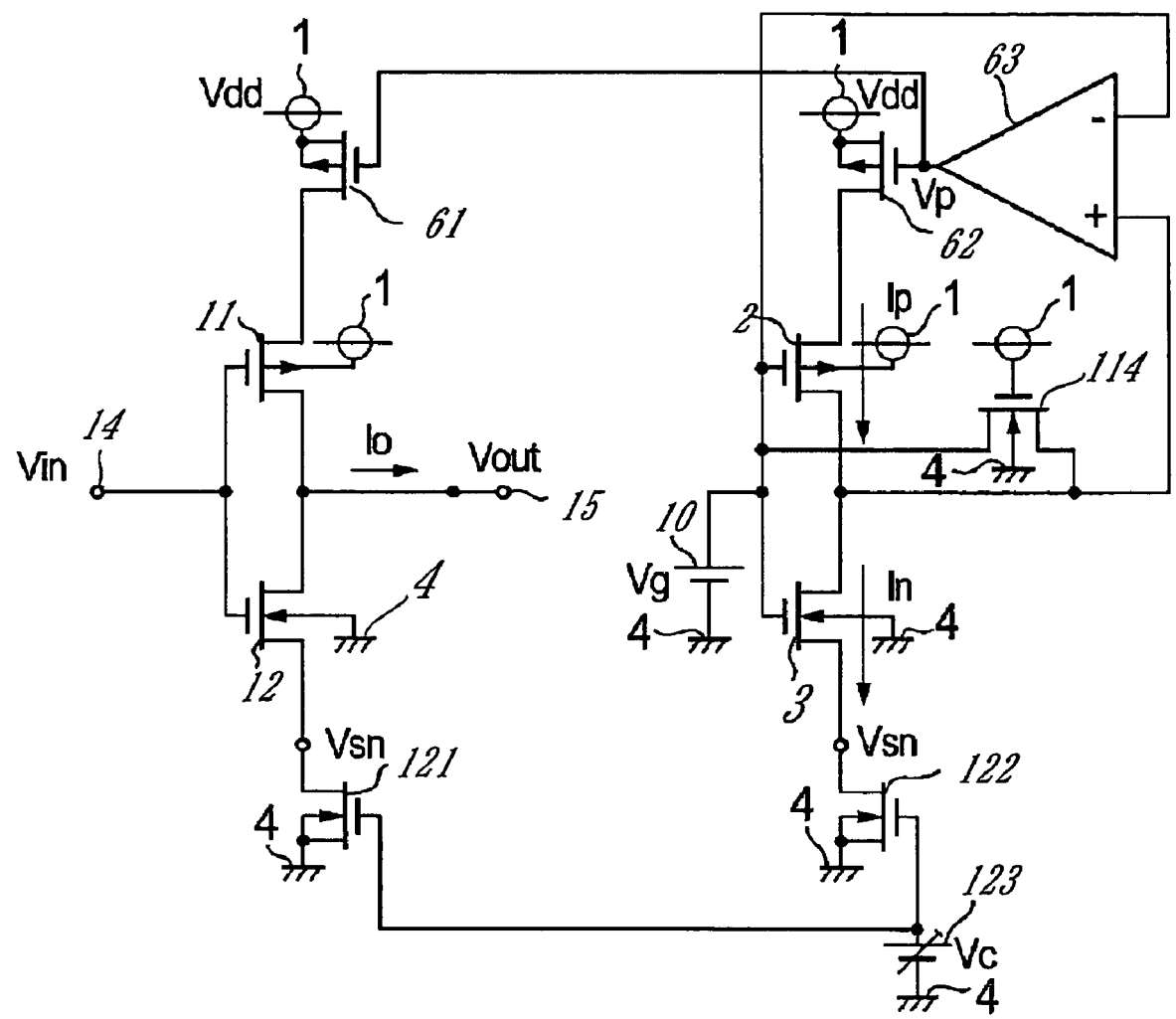
FIG. 11 is a circuit diagram showing a configuration of an amplifier circuit according to a fifth embodiment of the present invention.

An amplifier circuit according to a fifth embodiment of the present invention is characterized in that the amplifier circuit according to the fifth embodiment has a gain varying function in addition to a DC offset eliminating function as in the fourth embodiment. FIG. 11 is a circuit diagram showing a configuration of the amplifier circuit according to the fifth embodiment of the present invention. In FIG. 11, the same reference numerals as in FIG. 6 and FIG. 10 denote the same or corresponding parts, and therefore description thereof will be omitted. Reference numeral 121 denotes an NMOS transistor (second NMOS transistor) interposed between a source of an NMOS transistor 12 and a ground part 4. Reference numeral 122 denotes an NMOS transistor (fourth NMOS transistor) formed identically with the NMOS transistor 121 and interposed between a source of an NMOS transistor 3 and the ground part 4. Reference numeral 123 denotes a variable voltage source connected to a gate of the NMOS transistor 121 and a gate of the NMOS transistor 122.

Since the amplifier circuit described above is formed within an identical chip and therefore goes through identical manufacturing processes, a PMOS transistor 61 and a PMOS transistor 62, a PMOS transistor 11 and a PMOS transistor 2, the NMOS transistor 12 and the NMOS transistor 3, and the NMOS transistor 121 and the NMOS transistor 122 can each be considered to have element characteristics such as drain current coefficients and threshold voltages equal to each other. That is, a circuit including the PMOS transistor 62, the PMOS transistor 2, the NMOS transistor 3, and the NMOS transistor 122 is given as a comparing circuit formed identically with a circuit including the PMOS transistor 61, the PMOS transistor 11, the NMOS transistor 12, and the NMOS transistor 121.

In the amplifier circuit shown in FIG. 11, the NMOS transistor 121, the variable voltage source 123, and the like include voltage control means for variably controlling a source potential of the NMOS transistor 12. The PMOS transistor 62, the PMOS transistor 2, the NMOS transistor 3, the NMOS transistor 122, an operational amplifier 63, a biasing voltage source 10, and the like include DC offset detecting means for detecting a DC offset occurring in a CMOS inverter circuit including the PMOS transistor 11 and the NMOS transistor 12 in a state in which the source potential of the NMOS transistor 12 is changed by the voltage control means, and applying a voltage adjusted so as to eliminate the DC offset to a gate of the PMOS transistor 61. Further, the DC offset detecting means and the PMOS transistor 61 include voltage shift means for decreasing a source potential of the PMOS transistor 11 to eliminate the DC offset.

Operation of the amplifier circuit shown in FIG. 11 will next be described. Let Vdd be a power supply voltage, Vc be a control voltage supplied by the variable voltage source 123, Vsn be the source potential of the NMOS transistor 12 and the NMOS transistor 3, Vg be a bias voltage supplied by the biasing voltage source 10, and Vp be an output voltage of the operational amplifier 63. As already described, the circuit including the PMOS transistor 62, the PMOS transistor 2, the NMOS transistor 3, and the NMOS transistor 122 is given as a comparing circuit formed identically with the circuit including the PMOS transistor 61, the PMOS transistor 11, the NMOS transistor 12, and the NMOS transistor 121. The same control voltage Vc is applied to the gate of the NMOS transistor 121 and the gate of the NMOS transistor 122, and the same voltage Vp for eliminating a DC offset is applied to gates of the PMOS transistor 61 and the PMOS transistor 62. Thus, for the bias voltage Vg, the MOS transistors in corresponding relation perform the same respective operations. In description below of circuit operation, numerical analysis will be performed assuming that in order to facilitate understanding, element characteristics of the PMOS transistor 61 and the PMOS transistor 11 are equal to each other and element characteristics of the NMOS transistor 12 and the NMOS transistor 121 are equal to each other. It is to be noted that the amplifier circuit according to the present invention does not require that the PMOS transistor 61 and the PMOS transistor 11, and the NMOS transistor 12 and the NMOS transistor 121 be each formed identically. Even when these transistors are formed differently, it is of course possible to obtain circuit characteristics similar to circuit characteristics to be determined by the following numerical analysis.

An equation (22) is obtained on the basis of a fact that a drain current of the NMOS transistor 121 in a non-saturation region and a drain current of the NMOS transistor 12 in a saturation region are equal to each other. An equation (23) is obtained by rearranging the equation (22). Then, by solving the equation (23) for Vsn, Vsn is given as expressed by an equation (24). As is clear from the equation (24), the source potential Vsn of the NMOS transistor 12 and the NMOS transistor 3 can be controlled by appropriately changing the voltage Vc of the variable voltage source 123.

$$2(Vc-Vtn)Vsn-Vsn^2=(Vg-Vsn-Vtn)^2 \qquad (22)$$

$$2Vsn-2(Vg+Vc-2Vtn)Vsn+(Vg-Vtn)^2=0 \qquad (23)$$

$$Vsn = \frac{Vg+Vc}{2} - Vtn - \frac{1}{2}\sqrt{(Vg+Vc-2Vtn)^2 - 2(Vg-Vtn)^2} \qquad (24)$$

$$= \frac{Vg+Vc}{2} - Vtn -$$

$$\frac{1}{2}\sqrt{Vc^2 + (2Vg-2Vtn)Vc + (Vg-2Vtn)^2 - 2(Vg-Vtn)^2}$$

$$= \frac{Vg+Vc}{2} - Vtn -$$

$$\frac{1}{2}\sqrt{Vc^2 + (2Vg-2Vtn)Vc - Vg^2 + 2Vtn^2}$$

An output current Io and a gain Ga of the amplifier circuit shown in FIG. 11 can be determined as expressed by an equation (25) and an equation (26). As is clear from the equation (26), the gain Ga of the CMOS inverter circuit can be controlled by appropriately changing the control voltage Vc.

$$Io = -Mn\left(1 + \sqrt{\frac{Mp}{Mn}}\right)(Vg - Vsn - Vtn)Vin \qquad (25)$$

-continued $$Ga = \frac{Vout}{Vin} = -Mn\left(1 + \sqrt{\frac{Mp}{Mn}}\right)(Vg - Vsn - Vtm)Ro \qquad (26)$$

$$= -Mn\left(1 + \sqrt{\frac{Mp}{Mn}}\right)\left\{\frac{Vg - Vc}{2} - \frac{1}{2}\sqrt{Vc^2 + (2Vg - 2Vtm)Vc - Vg^2 + 2Vtm^2}\right\}Ro$$

As described above, the fifth embodiment includes the voltage control means for variably controlling the source potential of the NMOS transistor 12 and the voltage shift means for decreasing the source potential of the PMOS transistor 11 to eliminate a DC offset. By appropriately changing the source potential of the NMOS transistor 12 and operating the voltage shift means so as to eliminate a DC offset, it is consequently possible to control the gain of the CMOS inverter circuit. Thus an amplifier circuit capable of eliminating a DC offset and controlling the gain can be obtained. In addition, since a correcting circuit does not need to be added to the output part of the CMOS inverter circuit including the PMOS transistor 11 and the NMOS transistor 12, it is possible to suppress degradation in frequency characteristics due to parasitic capacitance, degradation in noise performance, and increase in current consumption.

Further, the voltage control means includes the NMOS transistor 121 interposed between the source of the NMOS transistor 12 and the ground part 4, and the voltage source 123 connected to the gate of the NMOS transistor 121. It is therefore possible to change the source potential of the NMOS transistor 12 by a simple configuration, and thus simplify circuit configuration.

Further, the voltage shift means includes the PMOS transistor 61 interposed between a source of the PMOS transistor 11 and a voltage source 1, and the DC offset detecting means for detecting a DC offset and applying a voltage adjusted so as to eliminate the DC offset to the gate of the PMOS transistor 61. Therefore, the source potential of the PMOS transistor 11 can be lowered to an appropriate level according to an amount of DC offset detected. Thus an amplifier circuit that can reliably eliminate a DC offset and has a high precision can be obtained.

Further, the DC offset detecting means includes: the PMOS transistor 62 formed identically with the PMOS transistor 61; the PMOS transistor 2 connected to the PMOS transistor 62 and formed identically with the PMOS transistor 11; the NMOS transistor 3 connected to the PMOS transistor 2 and formed identically with the NMOS transistor 12; the NMOS transistor 122 connected to the NMOS transistor 3, having a gate connected to the variable voltage source 123, and formed identically with the NMOS transistor 121; the voltage source 10 for applying a direct-current bias voltage to a gate of the PMOS transistor 2 and a gate of the NMOS transistor 3; and the operational amplifier 63 having an inverting input part and a non-inverting input part connected to an input part and an output part, respectively, of a CMOS including the PMOS transistor 2 and the NMOS transistor 3, and having an output part connected to the gate of the PMOS transistor 61 and the gate of the PMOS transistor 62. It is therefore possible to realize the DC offset detecting means for detecting a DC offset with high precision by a simple configuration, and thus simplify circuit configuration.

Sixth Embodiment

Figure 12:
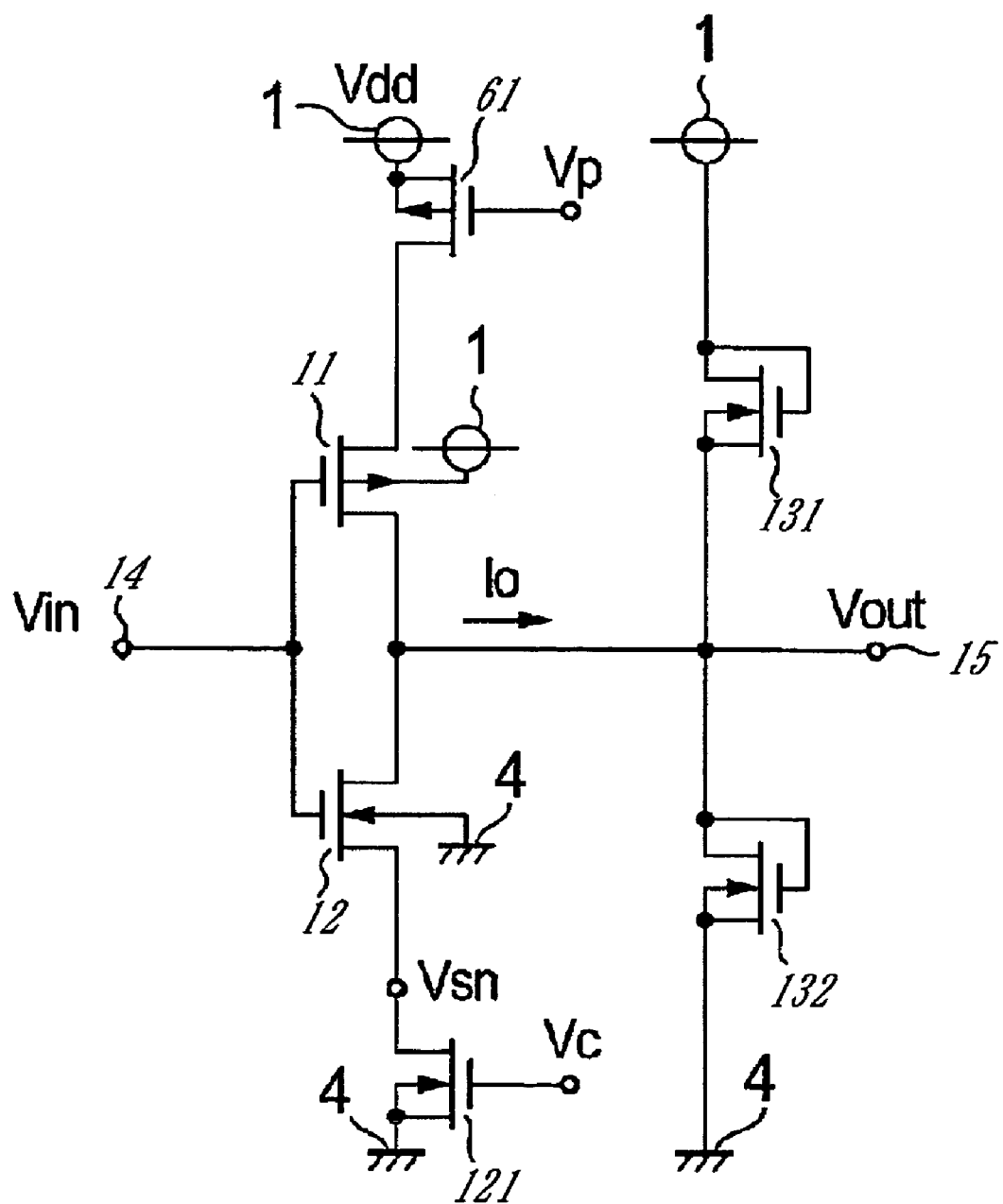
FIG. 12 is a circuit diagram showing a configuration of an amplifier circuit according to a sixth embodiment of the present invention.
Figure 13A:
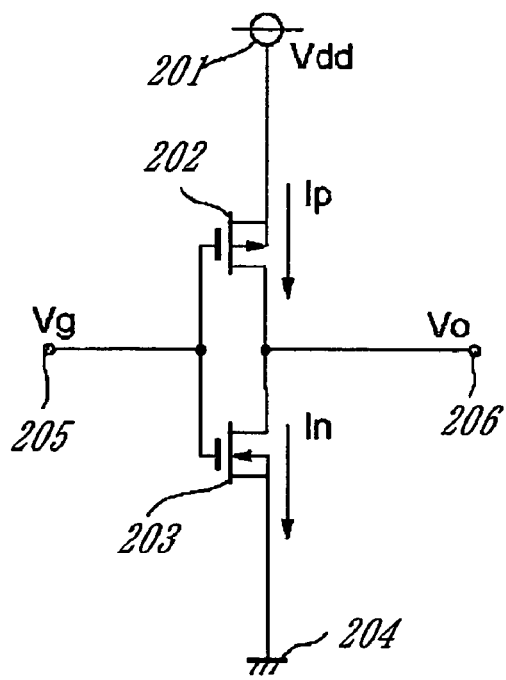
FIGS. 13A and 13B are diagrams showing an example of configuration of a CMOS inverter circuit as an analog signal processing circuit.
Figure 13B:
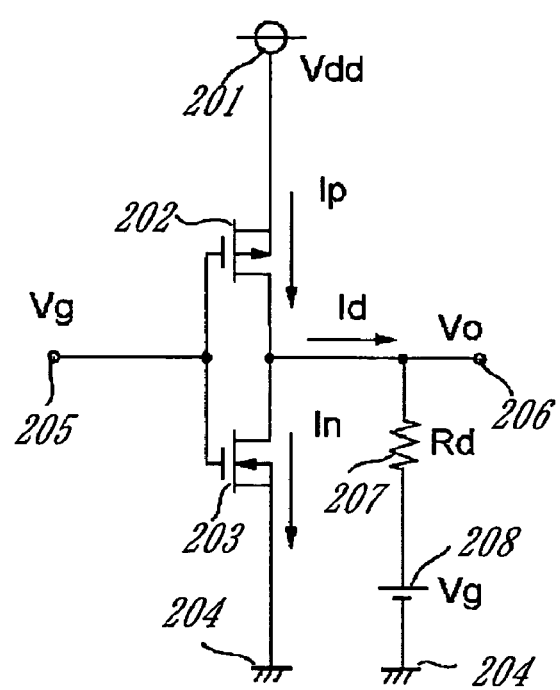

An amplifier circuit according to a sixth embodiment of the present invention is characterized in that MOS transistors are connected as a load to an output terminal. FIG. 12 is a circuit diagram showing a configuration of the amplifier circuit according to the sixth embodiment of the present invention. In FIG. 12, the same reference numerals as in FIG. 11 denote the same or corresponding parts, and therefore description thereof will be omitted. Reference numeral 131 denotes an NMOS transistor (first load MOS transistor) interposed between a voltage source 1 and an output terminal 15, and having a drain and a gate short-circuited. Reference numeral 132 denotes an NMOS transistor (second load MOS transistor) interposed between a ground part 4 and the output terminal 15, and having a drain and a gate short-circuited. Incidentally, the DC offset detecting means and the like shown in FIG. 11 are omitted.

Operation of the amplifier circuit shown in FIG. 12 will next be described. Letting Mn' be a drain current coefficient of the NMOS transistors 131 and 132, and Gmn' be a mutual conductance of the NMOS transistors 131 and 132, a resistance value Rd of the load formed by the NMOS transistors 131 and 132 is given as expressed by an equation (27). A gain Gb of the amplifier circuit shown in FIG. 12 is given as expressed by an equation (28) on the basis of the equation (25) and the equation (27). As is clear from the equation (28), the gain of the amplifier circuit can be set on the basis of a ratio between a drain current coefficient Mn of an NMOS transistor 12 and an NMOS transistor 121 and the drain current coefficient Mn' of the NMOS transistor 131 and the NMOS transistor 132. That is, the gain Gb can be set appropriately by changing a ratio of channel length or channel width of the NMOS transistors 131 and 132 to channel length or channel width of the NMOS transistors 12 and 121.

$$Rd = \frac{1}{Gmn'} = \frac{1}{2Mn'(Vg - Vtn)} \qquad (27)$$

$$Gb = \frac{Io \cdot Rd}{Vin} = -\frac{Mn}{1Mn'}\left(1 + \sqrt{\frac{Mp}{Mn}}\right)\frac{Vg - Vsn - Vtn}{Vg - Vtn} \qquad (28)$$

As described above, the sixth embodiment includes the NMOS transistor 131 interposed between the output terminal 15 and the voltage source 1, and having a drain and a gate short-circuited, and the NMOS transistor 132 interposed between the output terminal 15 and the ground part 4, and having a drain and a gate short-circuited. Therefore, a load for extracting a voltage output can be provided by using the MOS transistors. It is thus possible to allow integration and reduce circuit scale. Further, the gain of the amplifier circuit can be set on the basis of a ratio in size such as channel length or channel width between the MOS transistors. Therefore, as compared with a case of extracting a voltage output using a resistance, errors occurring in gain due to manufacturing variations can be reduced, thus increasing precision of the amplifier circuit. It is to be noted that PMOS transistors may be used as load transistors, providing similar effects to those of the NMOS transistors.

It is to be noted that the amplifier circuits described by way of the foregoing first to sixth embodiments do not limit the present invention but are disclosed to be illustrative of the present invention. The technical scope of the present invention is defined by claims, and various design changes may be made within the technical scope of the invention described in the claims. For example, a number of CMOS inverter circuits connected to the DC offset detecting circuit as shown in FIG. 3, FIG. 6, FIG. 9, FIG. 10, FIG. 11, and FIG. 12 is not limited to one; a plurality of CMOS inverter circuits may be connected to the DC offset detecting circuit. By commonly connecting signal input parts and signal output parts of the CMOS inverter circuits in such a configuration, an amplifier circuit with a high driving capability can be obtained. Also, while in the sixth embodiment, the load MOS transistors are connected to the output terminal 15 of the amplifier circuit shown in FIG. 11, it is of course possible to connect load MOS transistors to the output terminal 15 of the amplifier circuit shown in FIG. 3, FIG. 6, FIG. 9, and FIG. 10.

The invention claimed is:

1. An amplifier circuit, comprising:
a first PMOS transistor;
a first NMOS transistor having a drain connected to a drain of said first PMOS transistor;
a signal input part connected to a gate of said first PMOS transistor and to a gate of said first NMOS transistor;
a signal output part connected to said drain of said first PMOS transistor and to said drain of said first NMOS transistor; and
at least one of first voltage shift means and second voltage shift means, said first voltage shift means for increasing a source voltage of said first NMOS transistor to reduce a DC offset, said second voltage shift means for decreasing a source voltage of said first PMOS transistor to reduce the DC offset;
said first voltage shift means including:
a second NMOS transistor interposed between a source of said first NMOS transistor and a ground part, and
a DC offset detecting means for detecting the DC offset and for applying a voltage that is adjustable so as to reduce the DC offset to a gate of said second NMOS transistor;
said DC offset detecting means including:
a third PMOS transistor having characteristics that are substantially identical with those of said first PMOS transistor,
a third NMOS transistor having a drain connected to a drain of said third PMOS transistor and having characteristics that are substantially identical with those of said first NMOS transistor,
a biasing voltage source for supplying a direct-current bias voltage to a gate of said third PMOS transistor and to a gate of said third NMOS transistor,
a fourth NMOS transistor having a drain connected to a source of said third NMOS transistor and having characteristics that are substantially identical with those of said second NMOS transistor, and
an operational amplifier having a non-inverting input part connected to the drain of said third PMOS transistor and to the drain of said third NMOS transistor, an inverting input part connected to the gate of said third PMOS transistor and to the gate of said third NMOS transistor, and an output part connected to the gate of said second NMOS transistor and to a gate of said fourth NMOS transistor.

2. The amplifier circuit as claimed in claim 1, wherein said first operational amplifier includes:
a fifth NMOS transistor and a sixth NMOS transistor having drains connected to each other to form a differential pair, said fifth NMOS transistor having a gate connected to the non-inverting input part, and said sixth NMOS transistor having a gate connected to the inverting input part,
a fifth PMOS transistor and a sixth PMOS transistor having gates connected to each other to form a current mirror,
a seventh NMOS transistor having a drain connected to a source of said fifth NMOS transistor,
an eighth NMOS transistor having a drain connected to a source of said sixth NMOS transistor,
a ninth NMOS transistor having a drain connected to a drain of said fifth PMOS transistor, and
a tenth NMOS transistor having a drain connected to a drain of said sixth PMOS transistor;
a gate of said seventh NMOS transistor, a gate of said tenth NMOS transistor, and the source of said sixth NMOS transistor being connected to each other;
a gate of said eighth NMOS transistor, a gate of said ninth NMOS transistor, and the source of said fifth NMOS transistor being connected to each other;
a part connecting the drain of said fifth PMOS transistor with the drain of said ninth NMOS transistor; and
a further part connecting the drain of said sixth PMOS transistor and the drain of said tenth NMOS transistor with the output part.

3. An amplifier circuit, comprising:
a first PMOS transistor;
a first NMOS transistor having a drain connected to a drain of said first PMOS transistor;
a signal input part connected to a gate of said first PMOS transistor and to a gate of said first NMOS transistor;
a signal output part connected to said drain of said first PMOS transistor and to said drain of said first NMOS transistor; and
at least one of first voltage shift means and second voltage shift means, said first voltage shift means for increasing a source voltage of said first NMOS transistor to reduce a DC offset, said second voltage shift means for decreasing a source voltage of said first PMOS transistor to reduce the DC offset;
said second voltage shift means including:
a second PMOS transistor interposed between a source of said first PMOS transistor and a voltage source; and
a DC offset detecting means for detecting the DC offset and for applying a voltage that is adjustable so as to reduce the DC offset to a gate of said second PMOS transistor;
said DC offset detecting means including:
a third PMOS transistor having characteristics that are substantially identical with those of said first PMOS transistor,
a third NMOS transistor having a drain connected to a drain of said third PMOS transistor and having characteristics that are substantially identical with those of said first NMOS transistor,
a biasing voltage source for supplying a direct-current bias voltage to a gate of said third PMOS transistor and to a gate of said third NMOS transistor,
a fourth PMOS transistor having a drain connected to a source of said third PMOS transistor and having characteristics that are substantially identical with those of said second PMOS transistor, and
an operational amplifier having a non-inverting input part connected to the drain of said third PMOS transistor and to the drain of said third NMOS transistor, an inverting input part connected to the gate of said third PMOS transistor and to the gate of said third NMOS transistor, and an output part connected to the gate of said second PMOS transistor and to a gate of said fourth PMOS transistor.

4. The amplifier circuit as claimed in claim 3, wherein said operational amplifier includes:
  a fifth PMOS transistor and a sixth PMOS transistor having drains connected to each other to form a differential pair, said fifth PMOS transistor having a gate connected to the non-inverting input part, and said sixth PMOS transistor having a gate connected to the inverting input part,
  a fifth NMOS transistor and a sixth NMOS transistor having gates connected to each other to form a current mirror,
  a seventh PMOS transistor having a drain connected to a source of said fifth PMOS transistor,
  an eighth PMOS transistor having a drain connected to a source of said sixth PMOS transistor,
  a ninth PMOS transistor having a drain connected to a drain of said fifth NMOS transistor, and
  a tenth PMOS transistor having a drain connected to a drain of said sixth NMOS transistor;
  a gate of said seventh PMOS transistor, a gate of said tenth PMOS transistor, and the source of said sixth PMOS transistor being connected to each other;
  a gate of said eighth PMOS transistor, a gate of said ninth PMOS transistor, and the source of said fifth PMOS transistor being connected to each other;
  a part connecting the drain of said fifth NMOS transistor with the drain of said ninth PMOS transistor; and
  a further part connecting the drain of said sixth NMOS transistor and the drain of said tenth PMOS transistor with the output part.

5. An amplifier circuit, comprising:
  a first PMOS transistor;
  a first NMOS transistor having a drain connected to a drain of said first PMOS transistor;
  a signal input part connected to a gate of said first PMOS transistor and to a gate of said first NMOS transistor;
  a signal output part connected to the drain of said first PMOS transistor and to the drain of said first NMOS transistor;
  voltage control means for variably controlling a source potential of said first PMOS transistor; and
  voltage shift means for increasing a source potential of said first NMOS transistor to eliminate a DC offset, said voltage shift means including:
  a second NMOS transistor interposed between a source of said first NMOS transistor and a ground part, and
  DC offset detecting means for detecting the DC offset and for applying a voltage that is adjustable so as to eliminate the DC offset to a gate of said second NMOS transistor;
  said voltage control means including:
  a second PMOS transistor interposed between a source of said first PMOS transistor and a voltage source, and
  a variable voltage source connected to a gate of said second PMOS transistor;
  said DC offset detecting means including:
  a third PMOS transistor having characteristics that are substantially identical with those of said first PMOS transistor,
  a third NMOS transistor having a drain connected to a drain of said third PMOS transistor and having characterics that are substantially identical with those of said first NMOS transistor,
  a biasing voltage source for supplying a direct-current bias voltage to a gate of said third PMOS transistor and to a gate of said third NMOS transistor,
  a fourth PMOS transistor interposed between a source of said third PMOS transistor and the variable voltage source and having a gate connected to said variable voltage source and having characteristics that are substantially identical with those of said second PMOS transistor,
  a fourth NMOS transistor interposed between a source of said third NMOS transistor and the ground part, and having characteristics that are substantially identical with those of said second NMOS transistor, and
  an operational amplifier having a non-inverting input part connected to the drain of said third PMOS transistor and to the drain of said third NMOS transistor, an inverting input part connected to the gate of said third PMOS transistor and to the gate of said third NMOS transistor, and an output part connected to the gate of said second NMOS transistor and to a gate of said fourth NMOS transistor.

6. An amplifier circuit, comprising:
  a first PMOS transistor;
  a first NMOS transistor having a drain connected to a drain of said first PMOS transistor;
  a signal input part connected to a gate of said first PMOS transistor and to a gate of said first NMOS transistor;
  a signal output part connected to the drain of said first PMOS transistor and to the drain of said first NMOS transistor;
  voltage control means for variably controlling a source potential of said first NMOS transistor; and
  voltage shift means for decreasing a source potential of said first PMOS transistor to eliminate a DC offset, said voltage shift means including:
  a second PMOS transistor interposed between a source of said first PMOS transistor and a voltage source, and
  DC offset detecting means for detecting the DC offset and applying a voltage that is adjustable so as to eliminate the DC offset to a gate of said second PMOS transistor;
  said voltage control means including:
  a second NMOS transistor interposed between a source of said first NMOS transistor and a ground part; and
  a variable voltage source connected to a gate of said second NMOS transistor; and
  said DC offset detecting means including:
  a third PMOS transistor having characteristics that are substantially identical with those of said first PMOS transistor;
  a third NMOS transistor having a drain connected to a drain of said third PMOS transistor and having characteristics that are substantially identical with those of said first NMOS transistor;
  a biasing voltage source for supplying a direct-current bias voltage to a gate of said third PMOS transistor and to a gate of said third NMOS transistor;
  a fourth NMOS transistor interposed between a source of said third NMOS transistor and the ground part and having a gate connected to said variable voltage source and having characteristics that are substantially identical with those of said second NMOS transistor;
  a fourth PMOS transistor interposed between a source of said third PMOS transistor and the voltage source and having characteristics that are substantially identical with those of said second PMOS transistor; and
  an operational amplifier having a non-inverting input part connected to the drain of said third PMOS transistor and to the drain of said third NMOS transistor, an inverting input part connected to the gate of said third PMOS transistor and to the gate of said third NMOS transistor, and an output part connected to the gate of said second PMOS transistor and to a gate of said fourth PMOS transistor.

7. The amplifier circuit as claimed in claim 6, further comprising:

a first load MOS transistor interposed between the signal output part and a voltage source and having a drain and a gate that are short-circuited to each other; and a second load MOS transistor interposed between the signal output part and a ground part and having a drain and a gate that are short-circuited to each other.

* * * * *